(12) United States Patent
Kale

(10) Patent No.: US 12,100,455 B2
(45) Date of Patent: Sep. 24, 2024

(54) WEIGHT CALIBRATION CHECK FOR INTEGRATED CIRCUIT DEVICES HAVING ANALOG INFERENCE CAPABILITY

(71) Applicant: Micron Technology, Inc., Boise, ID (US)

(72) Inventor: Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 143 days.

(21) Appl. No.: 17/940,945

(22) Filed: Sep. 8, 2022

(65) Prior Publication Data

US 2024/0087653 A1    Mar. 14, 2024

(51) Int. Cl.
*G11C 16/12* (2006.01)
*G06F 7/544* (2006.01)
*G11C 16/24* (2006.01)
*G11C 16/26* (2006.01)

(52) U.S. Cl.
CPC ............ *G11C 16/12* (2013.01); *G06F 7/5443* (2013.01); *G11C 16/24* (2013.01); *G11C 16/26* (2013.01)

(58) Field of Classification Search
CPC ......... G11C 16/12; G11C 16/24; G11C 16/26; G06F 7/5443
See application file for complete search history.

(56) References Cited

U.S. PATENT DOCUMENTS

| 11,393,546 B2 * | 7/2022 | Tran ..................... G11C 16/10 |
| 11,581,039 B2 * | 2/2023 | Khwa .................... G11C 11/54 |
| 11,651,835 B1 * | 5/2023 | Kim ................. G05B 19/41875 |
| | | 365/200 |

\* cited by examiner

*Primary Examiner* — Vanthu T Nguyen
(74) *Attorney, Agent, or Firm* — Greenberg Traurig

(57) ABSTRACT

An integrated circuit device having a mechanism to check calibration of memory cells configured to perform operations of multiplication and accumulation. The integrated circuit device programs, in a first mode, threshold voltages of first memory cells in a memory cell array to store weight data, and programs, in a second mode, threshold voltages of second memory cells in the memory cell array to store a first result of applying an operation of multiplication and accumulation to a sample input and the weight data. During a calibration check, the integrated circuit device performs the operation using the first memory cells to obtain a second result, and compares the first result, retrieved from the second memory cells, and the second result to determine whether calibration of output current characteristics of the first memory cells programmed in the first mode is corrupted.

20 Claims, 18 Drawing Sheets

WEIGHT CALIBRATION CHECK FOR INTEGRATED CIRCUIT DEVICES HAVING ANALOG INFERENCE CAPABILITY

TECHNICAL FIELD

At least some embodiments disclosed herein relate to memory systems in general and more particularly, but not limited to, memory cells configured to perform computations of multiplication and accumulation circuits.

BACKGROUND

Image sensors can generate large amounts of data. It is inefficient to transmit image data from the image sensors to general-purpose microprocessors (e.g., central processing units (CPU)) for processing for some applications, such as image segmentation, object recognition, feature extraction, etc.

Some image processing can include intensive computations involving multiplications of columns or matrices of elements for accumulation. Some specialized circuits have been developed for the acceleration of multiplication and accumulation operations. For example, a multiplier-accumulator (MAC unit) can be implemented using a set of parallel computing logic circuits to achieve a computation performance higher than general-purpose microprocessors. For example, a multiplier-accumulator (MAC unit) can be implemented using a memristor crossbar.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
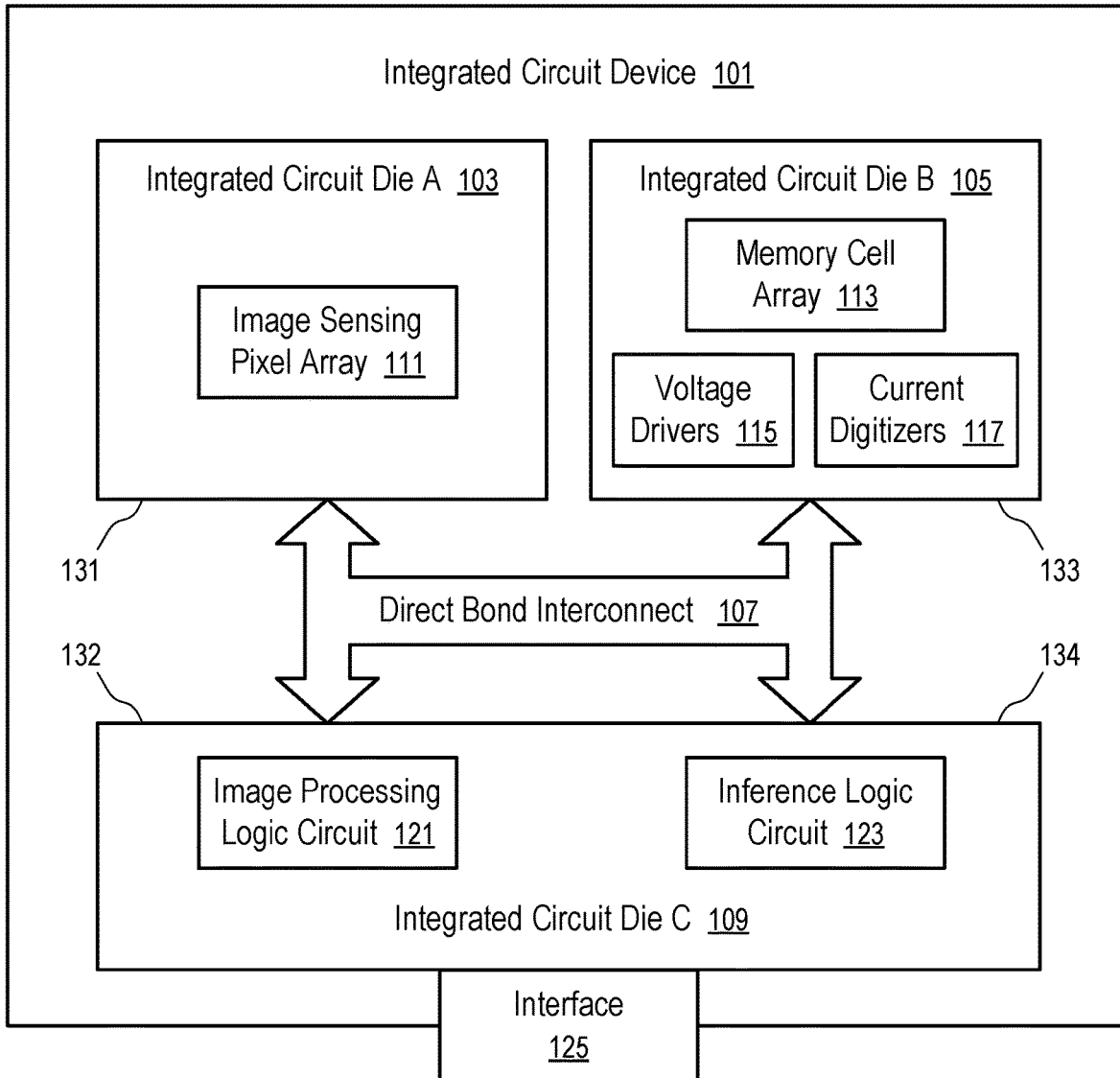
FIG. 1 shows an integrated circuit device having an image sensing pixel array, a memory cell array, and circuits to perform inference computations according to one embodiment.

At least some embodiments disclosed herein provide techniques of implementing computations of artificial neural networks to process images using integrated circuit devices. Such integrated circuit devices can include image sensing pixel arrays, memory cell arrays, and circuits to use the memory cell arrays to perform inference computation on image data from the image sensing pixel arrays.

For example, an image sensor can be configured with an analog capability to support inference computations, such as computations of an artificial neural network. Such an image sensor can be implemented as an integrated circuit device having an image sensor chip and a memory chip bonded to a logic wafer. The memory chip can have a 3D memory array configured to support multiplication and accumulation operations.

The memory chip can be connected directly to a portion of the logic wafer via heterogeneous direct bonding, also known as hybrid bonding or copper hybrid bonding.

Direct bonding is a type of chemical bonds between two surfaces of material meeting various requirements. Direct bonding of wafer typically includes pre-processing wafers, pre-bonding the wafers at room temperature, and annealing at elevated temperatures. For example, direct bonding can be used to join two wafers of a same material (e.g., silicon); anodic bonding can be used to join two wafers of different materials (e.g., silicon and borosilicate glass); eutectic bonding can be used to form a bonding layer of eutectic alloy based on silicon combining with metal to form a eutectic alloy.

Hybrid bonding can be used to join two surfaces having metal and dielectric material to form a dielectric bond with an embedded metal interconnect from the two surfaces. The hybrid bonding can be based on adhesives, direct bonding of a same dielectric material, anodic bonding of different dielectric materials, eutectic bonding, thermocompression bonding of materials, or other techniques, or any combination thereof.

Copper microbump is a traditional technique to connect dies at packaging level. Tiny metal bumps can be formed on dies as microbumps and connected for assembling into an integrated circuit package. It is difficult to use microbump for high density connections at a small pitch (e.g., 10 micrometers). Hybrid bonding can be used to implement connections at such a small pitch not feasible via microbump.

The image sensor chip can be configured on another portion of the logic wafer and connected via hybrid bonding (or a more conventional approach, such as microbumps).

In one configuration, the image sensor chip and the memory chip are placed side by side on the top of the logic wafer. Alternatively, the image sensor chip is connected to one side of the logic wafer (e.g., top surface); and the memory chip is connected to the other side of the logic wafer (e.g., bottom surface).

The logic wafer has a logic circuit configured to process images from the image sensor chip, and another logic circuit configured to operate the memory cells in the memory chip to perform multiplications and accumulation operations.

The memory chip can have multiple layers of memory cells. Each memory cell can be programmed to store a bit of a binary representation of an integer weight. Each input line can be applied a voltage according to a bit of an integer. Columns of memory cells can be used to store bits of a weight matrix; and a set of input lines can be used to control voltage drivers to apply read voltages on rows of memory cells according to bits of an input vector.

The threshold voltage of a memory cell used for multiplication and accumulation operations can be programmed such that the current going through the memory cell subjecting to a predetermined read voltage is either a predetermined amount representing a value of one stored in the memory cell, or negligible to represent a value of zero stored in the memory cell. When the predetermined read voltage is not applied, the current going through the memory cell is negligible regardless of the value stored in the memory cell. As a result of the configuration, the current going through the memory cell corresponds to the result of 1-bit weight, as stored in the memory cell, multiplied by 1-bit input, corresponding to the presence or the absence of the predetermined read voltage driven by a voltage driver controlled by the 1-bit input. Output currents of the memory cells, representing the results of a column of 1-bit weights stored in the memory cells and multiplied by a column of 1-bit inputs respective, are connected to a common line for summation. The summed current in the common line is a multiple of the predetermined amount; and the multiples can be digitized and determined using an analog to digital converter. Such results of 1-bit to 1-bit multiplications and accumulations can be performed for different significant bits of weights and different significant bits of inputs. The results for different significant bits can be shifted to apply the weights of the respective significant bits for summation to obtain the results of multiplications of multi-bit weights and multi-bit inputs with accumulation, as further discussed below.

Using the capability of performing multiplication and accumulation operations implemented via memory cell arrays, the logic circuit in the logic wafer can be configured to perform inference computations, such as the computation of an artificial neural network.

FIG. 1 shows an integrated circuit device 101 having an image sensing pixel array 111, a memory cell array 113, and circuits to perform inference computations according to one embodiment.

In FIG. 1, the integrated circuit device 101 has an integrated circuit die 109 having logic circuits 121 and 123, an integrated circuit die 103 having the image sensing pixel array 111, and an integrated circuit die 105 having a memory cell array 113.

The integrated circuit die 109 having logic circuits 121 and 123 can be considered a logic chip; the integrated circuit die 103 having the image sensing pixel array 111 can be considered an image sensor chip; and the integrated circuit die 105 having the memory cell array 113 can be considered a memory chip.

Figure 4:
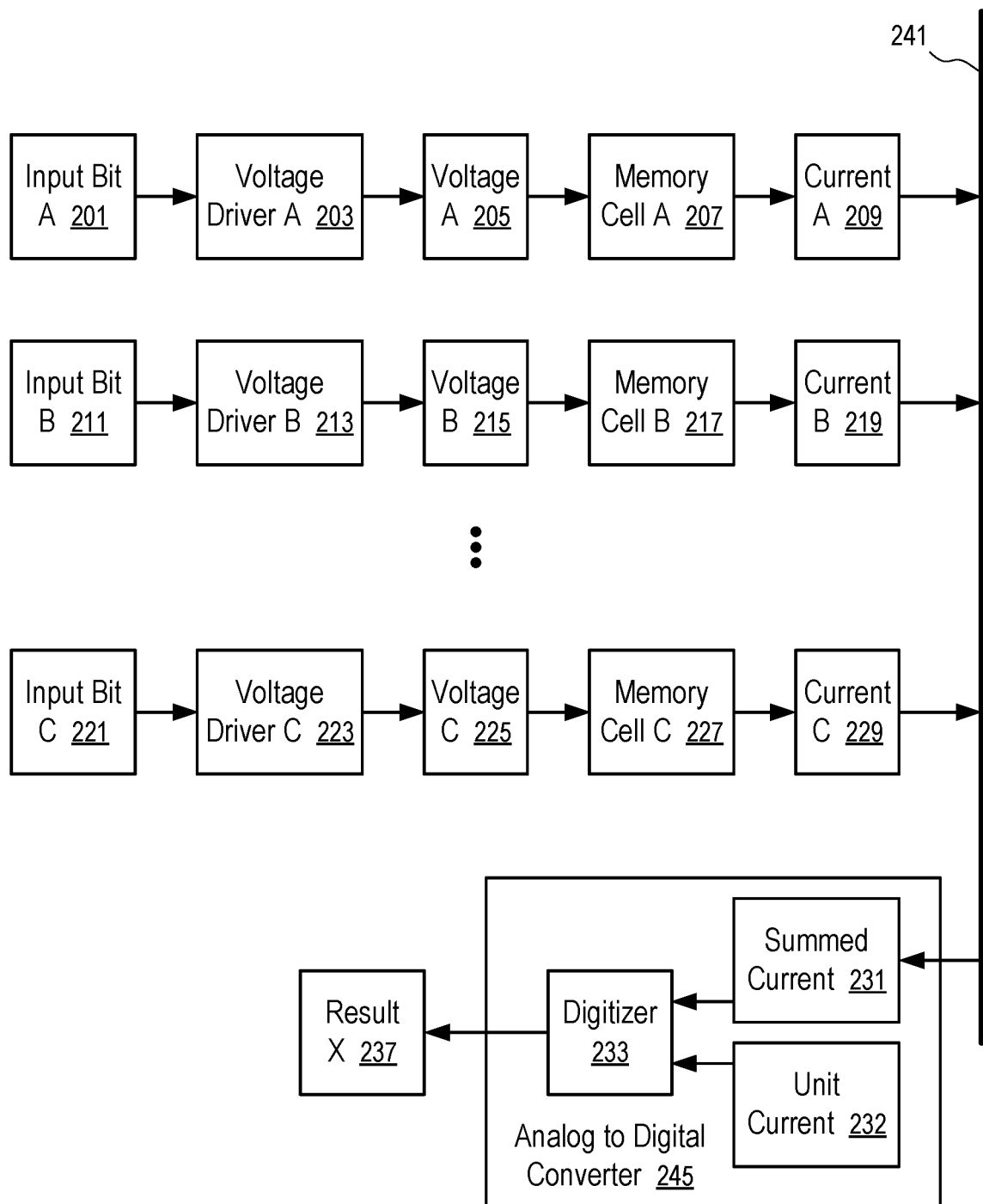
FIG. 4 shows the computation of a column of weight bits multiplied by a column of input bits to provide an accumulation result according to one embodiment.
Figure 5:
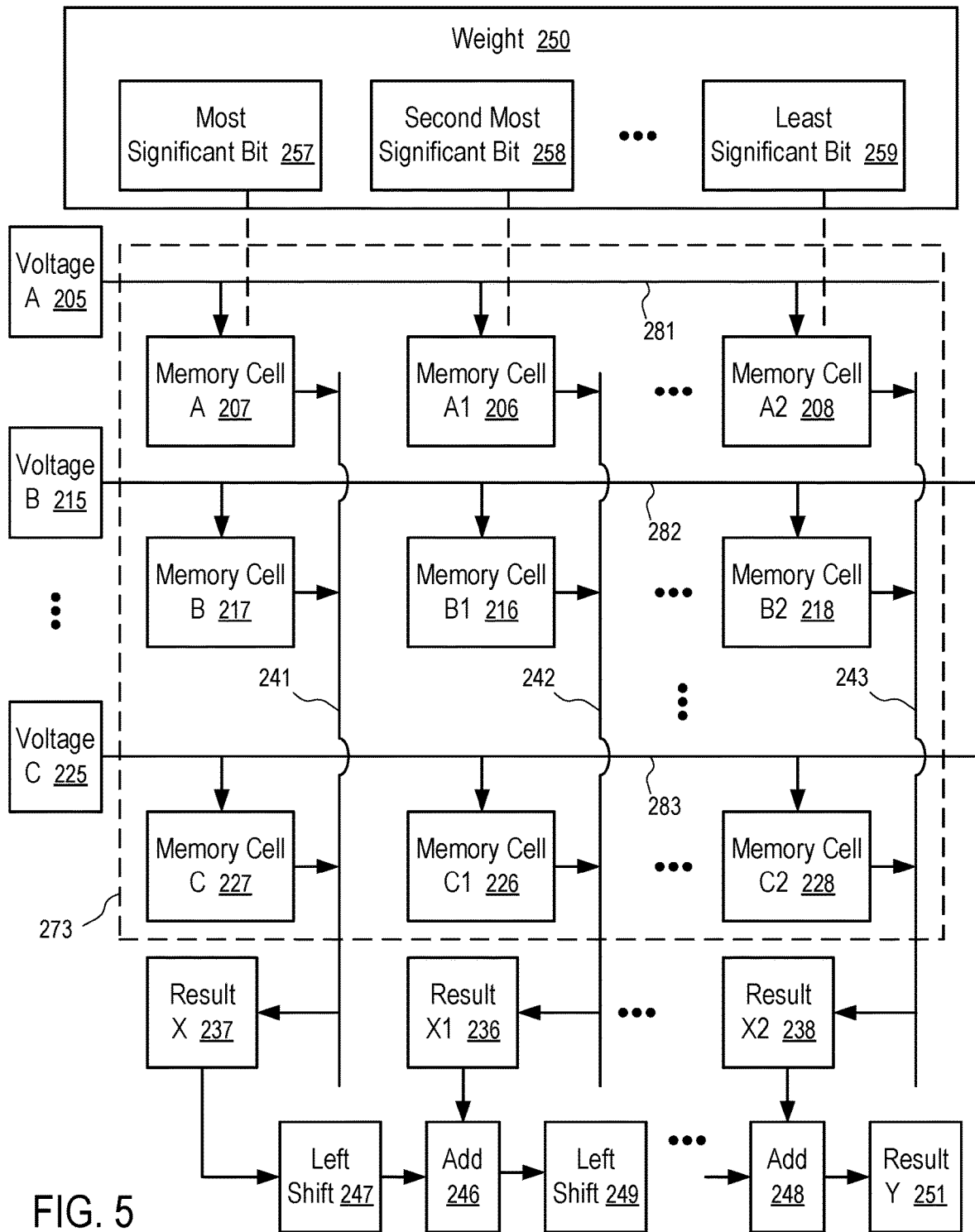
FIG. 5 shows the computation of a column of multi-bit weights multiplied by a column of input bits to provide an accumulation result according to one embodiment.

In FIG. 1, the integrated circuit die 105 having the memory cell array 113 further includes voltage drivers 115 and current digitizers 117. The memory cell array 113 are connected such that currents generated by the memory cells in response to voltages applied by the voltage drivers 115 are summed in the array 113 for columns of memory cells (e.g., as illustrated in FIG. 4 and FIG. 5); and the summed currents are digitized to generate the sum of bit-wise multiplications. The inference logic circuit 123 can be configured to instruct the voltage drivers 115 to apply read voltages according to a column of inputs, perform shifts and summations to generate the results of a column or matrix of weights multiplied by the column of inputs with accumulation.

The inference logic circuit 123 can be further configured to perform inference computations according to weights stored in the memory cell array 113 (e.g., the computation of an artificial neural network) and inputs derived from the image data generated by the image sensing pixel array 111. Optionally, the inference logic circuit 123 can include a programmable processor that can execute a set of instructions to control the inference computation. Alternatively, the inference computation is configured for a particular artificial neural network with certain aspects adjustable via weights stored in the memory cell array 113. Optionally, the inference logic circuit 123 is implemented via an application-specific integrated circuit (ASIC), a field-programmable gate array (FPGA), or a core of a programmable microprocessor.

In FIG. 1, the integrated circuit die 105 having the memory cell array 113 has a bottom surface 133; and the integrated circuit die 109 having the inference logic circuit 123 has a portion of a top surface 134. The two surfaces 133 and 134 can be connected via hybrid bonding to provide a portion of a direct bond interconnect 107 between the metal portions on the surfaces 133 and 134.

Similarly, the integrated circuit die 103 having the image sensing pixel array 111 has a bottom surface 131; and the integrated circuit die 109 having the inference logic circuit 123 has another portion of its top surface 132. The two surfaces 131 and 132 can be connected via hybrid bonding to provide a portion of the direct bond interconnect 107 between the metal portions on the surfaces 131 and 132.

An image sensing pixel in the array 111 can include a light sensitive element configured to generate a signal responsive to intensity of light received in the element. For example, an image sensing pixel implemented using a complementary metal-oxide-semiconductor (CMOS) technique or a charge-coupled device (CCD) technique can be used.

In some implementations, the image processing logic circuit 121 is configured to pre-process an image from the image sensing pixel array 111 to provide a processed image as an input to the inference computation controlled by the inference logic circuit 123.

Optionally, the image processing logic circuit 121 can also use the multiplication and accumulation function provided via the memory cell array 113.

In some implementations, the direct bond interconnect 107 includes wires for writing image data from the image sensing pixel array 111 to a portion of the memory cell array 113 for further processing by the image processing logic circuit 121 or the inference logic circuit 123, or for retrieval via an interface 125.

The inference logic circuit 123 can buffer the result of inference computations in a portion of the memory cell array 113.

The interface 125 of the integrated circuit device 101 can be configured to support a memory access protocol, or a storage access protocol or any combination thereof. Thus, an external device (e.g., a processor, a central processing unit) can send commands to the interface 125 to access the storage capacity provided by the memory cell array 113.

For example, the interface 125 can be configured to support a connection and communication protocol on a computer bus, such as a peripheral component interconnect express (PCIe) bus, a serial advanced technology attachment (SATA) bus, a universal serial bus (USB) bus, a compute express link, etc. In some embodiments, the interface 125 can be configured to include an interface of a solid-state drive (SSD), such as a ball grid array (BGA) SSD. In some embodiments, the interface 125 is configured to include an interface of a memory module, such as a double data rate (DDR) memory module, a dual in-line memory module, etc. The interface 125 can be configured to support a communication protocol such as a protocol according to non-volatile memory express (NVMe), non-volatile memory host controller interface specification (NVMHCIS), etc.

The integrated circuit device 101 can appear to be a memory sub-system from the point of view of a device in communication with the interface 125. Through the interface 125 an external device (e.g., a processor, a central processing unit) can access the storage capacity of the memory cell array 113. For example, the external device can store and update weight matrices and instructions for the inference logic circuit 123, retrieve images generated by the image sensing pixel array 111 and processed by the image processing logic circuit 121, and retrieve results of inference computations controlled by the inference logic circuit 123.

Figure 2:
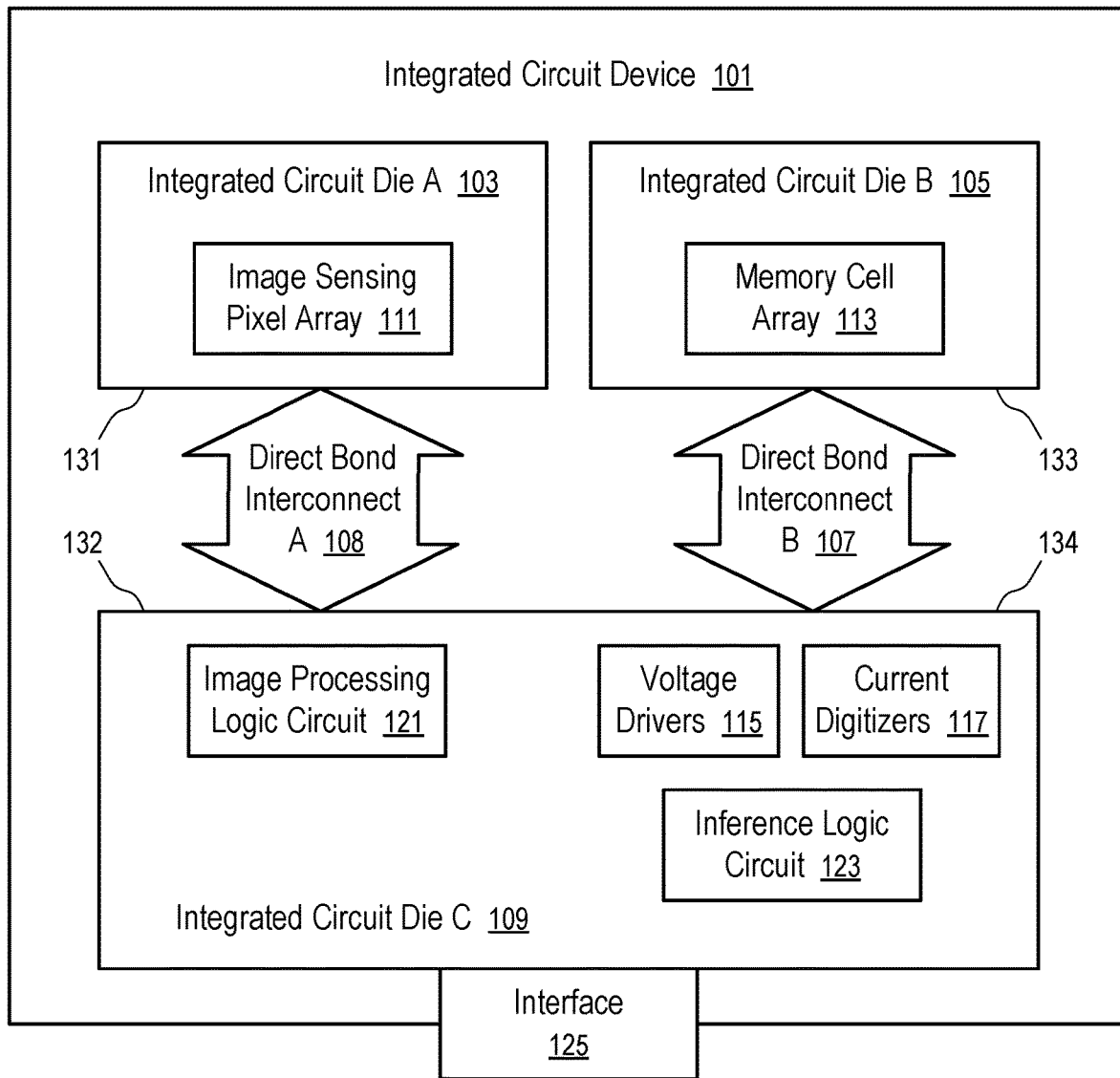
FIG. 2 and FIG. 3 illustrate different configurations of integrated imaging and inference devices according to some embodiments.

In some implementations, some of the circuits (e.g., voltage drivers 115, or current digitizers 117, or both) are implemented in the integrated circuit die 109 having the inference logic circuit 123, as illustrated in FIG. 2.

In FIG. 1, the image sensor chip and the memory chip are placed side by side on the same side (e.g., top side) of the logic chip. Alternatively, the image sensor chip and the memory chip can be placed on different sides (e.g., top surface and bottom surface) of the logic chip, as illustrated in FIG. 3.

Figure 3:
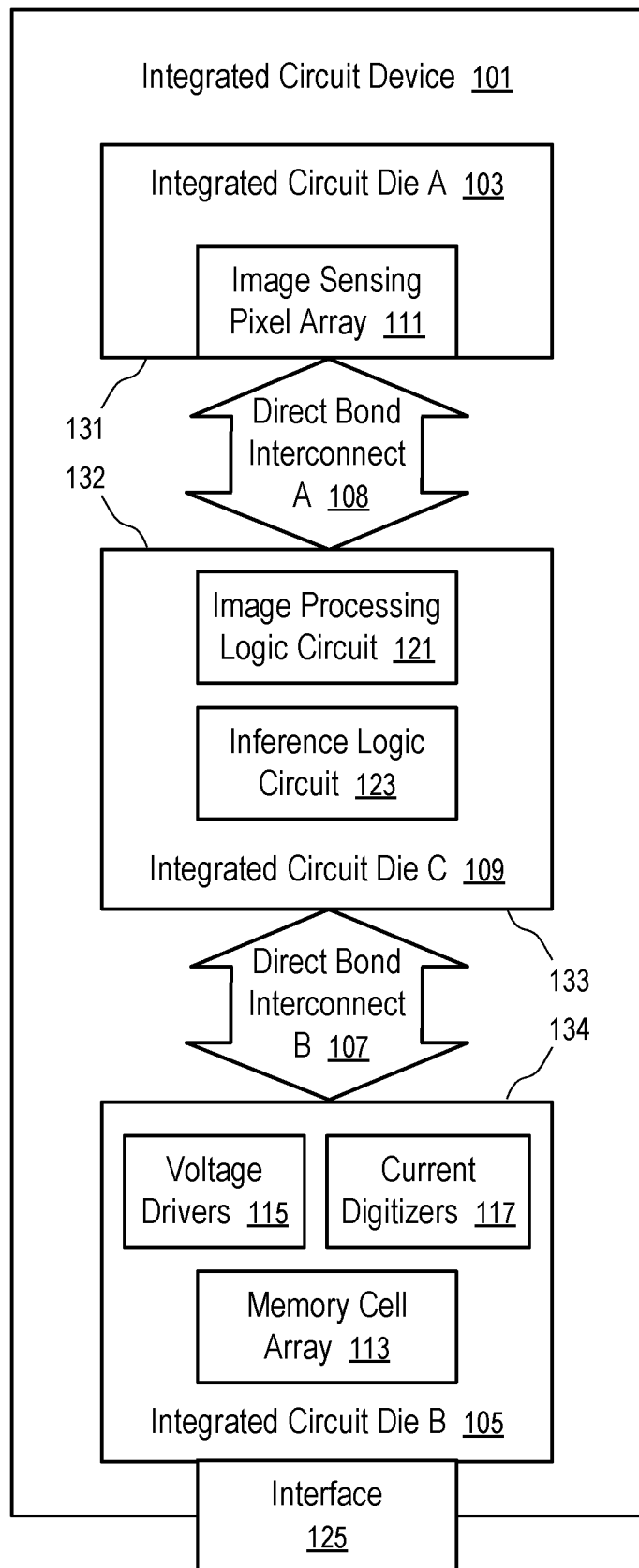

FIG. 2 and FIG. 3 illustrate different configurations of integrated imaging and inference devices according to some embodiments.

Similar to the integrated circuit device 101 of FIG. 1, the device 101 in FIG. 2 and FIG. 3 can also have an integrated circuit die 109 having image processing logic circuits 121 and inference logic circuit 123, an integrated circuit die 103 having an image sensing pixel array 111, and an integrated circuit die 105 having a memory cell array 113.

However, in FIG. 2, the voltage drivers 115 and current digitizers 117 are configured in the integrated circuit die 109 having the inference logic circuit 123. Thus, the integrated circuit die 105 of the memory cell array 113 can be manufactured to contain memory cells and wire connections without added complications of voltage drivers 115 and current digitizers 117.

In FIG. 2, a direct bond interconnect 108 connects the image sensing pixel array 111 to the image processing logic circuit 121. Alternatively, microbumps can be used to connect the image sensing pixel array 111 to the image processing logic circuit 121.

In FIG. 2, another direct bond interconnect 107 connects the memory cell array 113 to the voltage drivers 115 and the current digitizers 117. Since the direct bond interconnects 107 and 108 are separate from each other, the image sensor chip may not write image data directly into the memory chip without going through the logic circuits in the logic chip.

Alternatively, a direct bond interconnect 107 as illustrated in FIG. 1 can be configured to allow the image sensor chip to write image data directly into the memory chip without going through the logic circuits in the logic chip.

Optionally, some of the voltage drivers 115, the current digitizers 117, and the inference logic circuits 123 can be configured in the memory chip, while the remaining portion is configured in the logic chip.

FIG. 1 and FIG. 2 illustrate configurations where the memory chip and the image sensor chip are placed side-by-side on the logic chip. During manufacturing of the integrated circuit devices 101, memory chips and image sensor chips can be placed on a surface of a logic wafer containing the circuits of the logic chips to apply hybrid bonding. The memory chips and image sensor chips can be combined to the logic wafer at the same time. Subsequently, the logic wafer having the attached memory chips and image sensor chips can be divided into chips of the integrated circuit devices (e.g., 101).

Alternatively, as in FIG. 3, the image sensor chip and the memory chip are placed on different sides of the logic chip.

In FIG. 3, the image sensor chip is connected to the logic chip via a direct bond interconnect 108 on the top surface 132 of the logic chip. Alternatively, microbumps can be used to connect the image sensor chip to the logic chip. The memory chip is connected to the logic chip via a direct bond interconnect 107 on the bottom surface 133 of the logic chip. During the manufacturing of the integrated circuit devices 101, an image sensor wafer can be attached to, bonded to, or combined with the top surface of the logic wafer in a process/operation; and the memory wafer can be attached to, bonded to, or combined with the bottom side of the logic wafer in another process. The combined wafers can be divided into chips of the integrated circuit devices 101.

FIG. 3 illustrates a configuration in which the voltage drivers 115 and current digitizers 117 are configured in the memory chip having the memory cell array 113. Alternatively, some of the voltage drivers 115, the current digitizers 117, and the inference logic circuit 123 are configured in the memory chip, while the remaining portion is configured in the logic chip disposed between the image sensor chip and the memory chip. In other implementations, the voltage drivers 115, the current digitizers 117, and the inference logic circuit 123 are configured in the logic chip, in a way similar to the configuration illustrated in FIG. 2.

In FIG. 1, FIG. 2, and FIG. 3, the interface 125 is positioned at the bottom side of the integrated circuit device 101, while the image sensor chip is positioned at the top side of the integrated device 101 to receive incident light for generating images.

The voltage drivers 115 in FIG. 1, FIG. 2, and FIG. 3 can be controlled to apply voltages to program the threshold voltages of memory cells in the array 113. Data stored in the memory cells can be represented by the levels of the programmed threshold voltages of the memory cells.

A typical memory cell in the array 113 has a nonlinear current to voltage curve. When the threshold voltage of the memory cell is programmed to a first level to represent a stored value of one, the memory cell allows a predetermined amount of current to go through when a predetermined read voltage higher than the first level is applied to the memory cell. When the predetermined read voltage is not applied (e.g., the applied voltage is zero), the memory cell allows a negligible amount of current to go through, comparing to the predetermined amount of current. On the other hand, when the threshold voltage of the memory cell is programmed to a second level higher than the predetermined read voltage to represent a stored value of zero, the memory cell allows a negligible amount of current to go through, regardless of whether the predetermined read voltage is applied. Thus, when a bit of weight is stored in the memory as discussed above, and a bit of input is used to control whether to apply the predetermined read voltage, the amount of current going through the memory cell as a multiple of the predetermined amount of current corresponds to the digital result of the stored bit of weight multiplied by the bit of input. Currents representative of the results of 1-bit by 1-bit multiplications can be summed in an analog form before digitized for shifting and summing to perform multiplication and accumulation of multi-bit weights against multi-bit inputs, as further discussed below.

FIG. 4 shows the computation of a column of weight bits multiplied by a column of input bits to provide an accumulation result according to one embodiment.

In FIG. 4, a column of memory cells 207, 217, . . . , 227 (e.g., in the memory cell array 113 of an integrated circuit device 101) can be programmed to have threshold voltages at levels representative of weights stored one bit per memory cell.

Voltage drivers 203, 213, . . . , 223 (e.g., in the voltage drivers 115 of an integrated circuit device 101) are configured to apply voltages 205, 215, . . . , 225 to the memory cells 207, 217, . . . , 227 respectively according to their received input bits 201, 211, . . . , 221.

For example, when the input bit 201 has a value of one, the voltage driver 203 applies the predetermined read voltage as the voltage 205, causing the memory cell 207 to output the predetermined amount of current as its output current 209 if the memory cell 207 has a threshold voltage programmed at a lower level, which is lower than the predetermined read voltage, to represent a stored weight of one, or to output a negligible amount of current as its output current 209 if the memory cell 207 has a threshold voltage programmed at a higher level, which is higher than the predetermined read voltage, to represent a stored weight of zero. However, when the input bit 201 has a value of zero, the voltage driver 203 applies a voltage (e.g., zero) lower than the lower level of threshold voltage as the voltage 205 (e.g., does not apply the predetermined read voltage), causing the memory cell 207 to output a negligible amount of current at its output current 209 regardless of the weight stored in the memory cell 207. Thus, the output current 209 as a multiple of the predetermined amount of current is representative of the result of the weight bit, stored in the memory cell 207, multiplied by the input bit 201.

Similarly, the current 219 going through the memory cell 217 as a multiple of the predetermined amount of current is representative of the result of the weight bit, stored in the memory cell 217, multiplied by the input bit 211; and the current 229 going through the memory cell 227 as a multiple of the predetermined amount of current is representative of the result of the weight bit, stored in the memory cell 227, multiplied by the input bit 221.

The output currents 209, 219, . . . , and 229 of the memory cells 207, 217, . . . , 227 are connected to a common line 241 for summation. The summed current 231 is compared to the unit current 232, which is equal to the predetermined amount of current, by a digitizer 233 of an analog to digital converter 245 to determine the digital result 237 of the column of weight bits, stored in the memory cells 207, 217, . . . , 227 respectively, multiplied by the column of input bits 201, 211, . . . , 221 respectively with the summation of the results of multiplications.

The sum of negligible amounts of currents from memory cells connected to the line 241 is small when compared to the unit current 232 (e.g., the predetermined amount of current). Thus, the presence of the negligible amounts of currents from memory cells does not alter the result 237 and is negligible in the operation of the analog to digital converter 245.

In FIG. 4, the voltages 205, 215, . . . , 225 applied to the memory cells 207, 217, . . . , 227 are representative of digitized input bits 201, 211, . . . , 221; the memory cells 207, 217, . . . , 227 are programmed to store digitized weight bits; and the currents 209, 219, . . . , 229 are representative of digitized results. Thus, the memory cells 207, 217, . . . , 227 do not function as memristors that convert analog voltages to analog currents based on their linear resistances over a voltage range; and the operating principle of the memory cells in computing the multiplication is fundamentally different from the operating principle of a memristor crossbar. When a memristor crossbar is used, conventional digital to analog converters are used to generate an input voltage proportional to inputs to be applied to the rows of memristor crossbar. When the technique of FIG. 4 is used, such digital to analog converters can be eliminated; and the operation of the digitizer 233 to generate the result 237 can be greatly simplified. The result 237 is an integer that is no larger than the count of memory cells 207, 217, . . . , 227 connected to the line 241. The digitized form of the output currents 209, 219, . . . , 229 can increase the accuracy and reliability of the computation implemented using the memory cells 207, 217, . . . , 227.

In general, a weight involving a multiplication and accumulation operation can be more than one bit. Multiple columns of memory cells can be used to store the different significant bits of weights, as illustrated in FIG. 5 to perform multiplication and accumulation operations.

The circuit illustrated in FIG. 4 can be considered a multiplier-accumulator unit configured to operate on a column of 1-bit weights and a column of 1-bit inputs. Multiple such a circuits can be connected in parallel to implement a multiplier-accumulator unit to operate on a column of multi-bit weights and a column of 1-bit inputs, as illustrated in FIG. 5.

The circuit illustrated in FIG. 4 can also be used to read the data stored in the memory cells 207, 217, . . . , 227. For example, to read the data or weight stored in the memory cell 207, the input bits 211, . . . , 221 can be set to zero to cause the memory cells 217, . . . , 227 to output negligible amount of currents into the line 241 (e.g., as a bitline). The input bit 201 is set to one to cause the voltage driver 203 to apply the predetermined read voltage. Thus, the result 237 from the digitizer 233 provides the data or weight stored in the memory cell 207. Similarly, the data or weight stored in the memory cell 217 can be read via applying one as the input bit 211 and zeros as the remaining input bits in the column; and data or weight stored in the memory cell 227 can be read via applying one as the input bit 221 and zeros as the other input bits in the column.

In general, the circuit illustrated in FIG. 4 can be used to select any of the memory cells 207, 217, . . . , 227 for read or write. A voltage driver (e.g., 203) can apply a programming voltage pulse to adjust the threshold voltage of a respective memory cell (e.g., 207) to erase data, to store data or weigh, etc.

FIG. 5 shows the computation of a column of multi-bit weights multiplied by a column of input bits to provide an accumulation result according to one embodiment.

In FIG. 5, a weight 250 in a binary form has a most significant bit 257, a second most significant bit 258, ..., a least significant bit 259. The significant bits 257, 258, ..., 259 can be stored in memory cells 207, 206, ..., 208 in a number of columns respectively in an array 273. The significant bits 257, 258, ..., 259 of the weight 250 are to be multiplied by the input bit 201 represented by the voltage 205 applied on a line 281 (e.g., a wordline) by a voltage driver 203 (e.g., as in FIG. 4).

Similarly, memory cells 217, 216, ..., 218 can be used to store the corresponding significant bits of a next weight to be multiplied by a next input bit 211 represented by the voltage 215 applied on a line 282 (e.g., a wordline) by a voltage driver 213 (e.g., as in FIG. 4); and memory cells 227, 226, ..., 228 can be used to store corresponding significant bits of a weight to be multiplied by the input bit 221 represented by the voltage 225 applied on a line 283 (e.g., a wordline) by a voltage driver 223 (e.g., as in FIG. 4).

The most significant bits (e.g., 257) of the weights (e.g., 250) stored in the respective rows of memory cells in the array 273 are multiplied by the input bits 201, 211, ..., 221 represented by the voltages 205, 215, ..., 225 and then summed as the current 231 in a line 241 and digitized using a digitizer 233, as in FIG. 4, to generate a result 237 corresponding to the most significant bits of the weights.

Similarly, the second most significant bits (e.g., 258) of the weights (e.g., 250) stored in the respective rows of memory cells in the array 273 are multiplied by the input bits 201, 211, ..., 221 represented by the voltages 205, 215, ..., 225 and then summed as a current in a line 242 and digitized to generate a result 236 corresponding to the second most significant bits.

Similarly, the least most significant bits (e.g., 259) of the weights (e.g., 250) stored in the respective rows of memory cells in the array 273 are multiplied by the input bits 201, 211, ..., 221 represented by the voltages 205, 215, ..., 225 and then summed as a current in a line 243 and digitized to generate a result 238 corresponding to the least significant bit.

The most significant bit can be left shifted by one bit to have the same weight as the second significant bit, which can be further left shifted by one bit to have the same weight as the next significant bit. Thus, the result 237 generated from multiplication and summation of the most significant bits (e.g., 257) of the weights (e.g., 250) can be applied an operation of left shift 247 by one bit; and the operation of add 246 can be applied to the result of the operation of left shift 247 and the result 236 generated from multiplication and summation of the second most significant bits (e.g., 258) of the weights (e.g., 250). The operations of left shift (e.g., 247, 249) can be used to apply weights of the bits (e.g., 257, 258, ...) for summation using the operations of add (e.g., 246, ..., 248) to generate a result 251. Thus, the result 251 is equal to the column of weights in the array 273 of memory cells multiplied by the column of input bits 201, 211, ..., 221 with multiplication results accumulated.

In general, an input involving a multiplication and accumulation operation can be more than 1 bit. Columns of input bits can be applied one column at a time to the weights stored in the array 273 of memory cells to obtain the result of a column of weights multiplied by a column of inputs with results accumulated as illustrated in FIG. 6.

The circuit illustrated in FIG. 5 can be used to read the data stored in the array 273 of memory cells. For example, to read the data or weight 250 stored in the memory cells 207, 206, ..., 208, the input bits 211, ..., 221 can be set to zero to cause the memory cells 217, 216, ..., 218, ..., 227, 226, ..., 228 to output negligible amount of currents into the line 241, 242, ..., 243 (e.g., as bitlines). The input bit 201 is set to one to cause the voltage driver 203 to apply the predetermined read voltage as the voltage 205. Thus, the results 237, 236, ..., 238 from the digitizers (e.g., 233) connected to the lines 241, 242, ..., 243 provide the bits 257, 258, ..., 259 of the data or weight 250 stored in the row of memory cells 207, 206, ..., 208. Further, the result 251 computed from the operations of shift 247, 249, ... and operations of add 246, ..., 248 provides the weight 250 in a binary form.

In general, the circuit illustrated in FIG. 5 can be used to select any row of the memory cell array 273 for read. Optionally, different columns of the memory cell array 273 can be driven by different voltage drivers. Thus, the memory cells (e.g., 207, 206, ..., 208) in a row can be programmed to write data in parallel (e.g., to store the bits 257, 258, ..., 259) of the weight 250.

Figure 6:
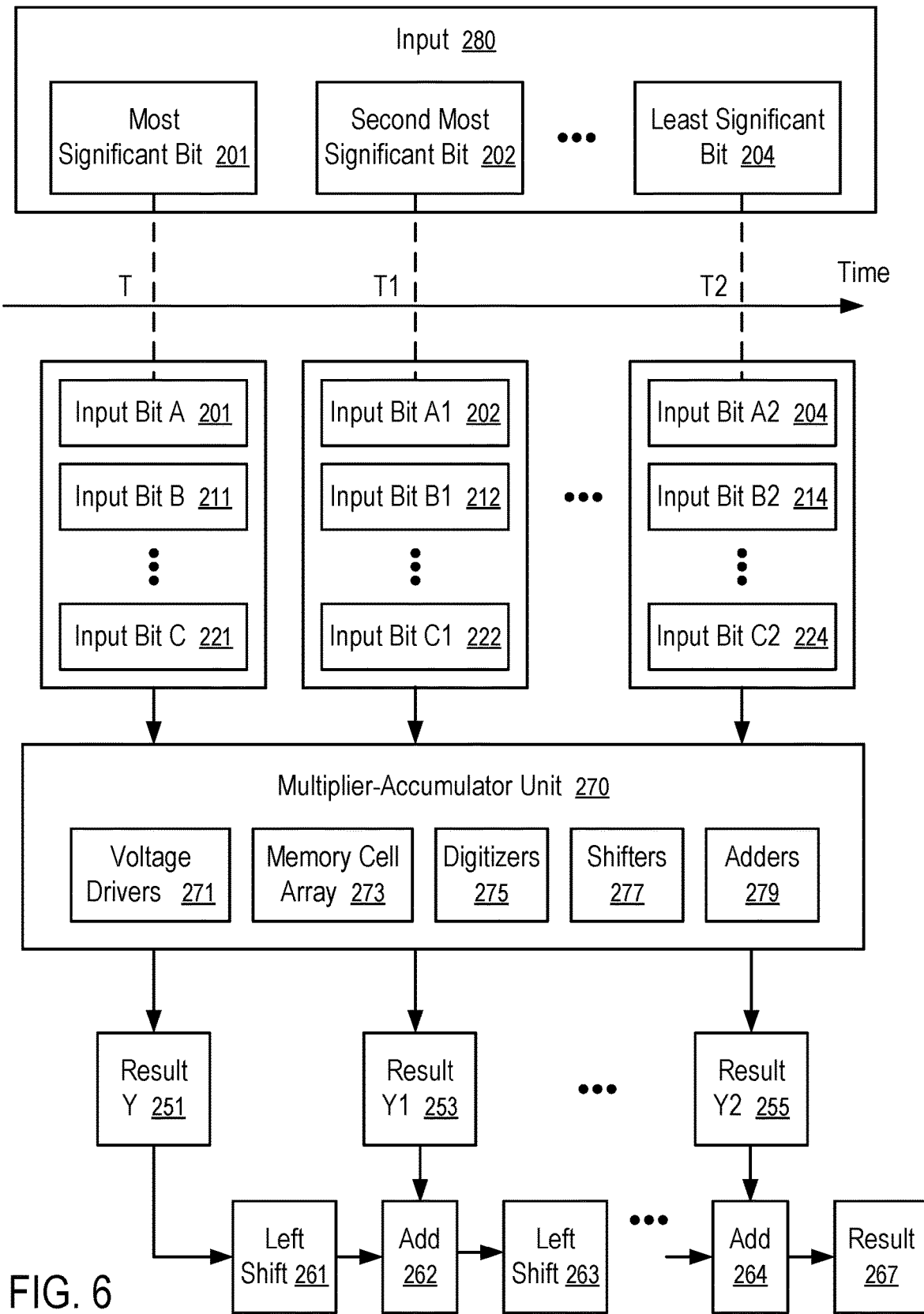
FIG. 6 shows the computation of a column of multi-bit weights multiplied by a column of multi-bit inputs to provide an accumulation result according to one embodiment.

FIG. 6 shows the computation of a column of multi-bit weights multiplied by a column of multi-bit inputs to provide an accumulation result according to one embodiment.

In FIG. 6, the significant bits of inputs (e.g., 280) are applied to a multiplier-accumulator unit 270 at a plurality of time instances T, T1, ..., T2.

For example, a multi-bit input 280 can have a most significant bit 201, a second most significant bit 202, ..., a least significant bit 204.

At time T, the most significant bits 201, 211, ..., 221 of the inputs (e.g., 280) are applied to the multiplier-accumulator unit 270 to obtain a result 251 of weights (e.g., 250), stored in the memory cell array 273, multiplied by the column of bits 201, 211, ..., 221 with summation of the multiplication results.

For example, the multiplier-accumulator unit 270 can be implemented in a way as illustrated in FIG. 5. The multiplier-accumulator unit 270 has voltage drivers 271 connected to apply voltages 205, 215, ..., 225 representative of the input bits 201, 211, ..., 221. The multiplier-accumulator unit 270 has a memory cell array 273 storing bits of weights as in FIG. 5. The multiplier-accumulator unit 270 has digitizers 275 to convert currents summed on lines 241, 242, ..., 243 for columns of memory cells in the array 273 to output results 237, 236, ..., 238. The multiplier-accumulator unit 270 has shifters 277 and adders 279 connected to combine the column result 237, 236, ..., 238 to provide a result 251 as in FIG. 5.

Similarly, at time T1, the second most significant bits 202, 212, ..., 222 of the inputs (e.g., 280) are applied to the multiplier-accumulator unit 270 to obtain a result 253 of weights (e.g., 250) stored in the memory cell array 273 and multiplied by the vector of bits 202, 212, ..., 222 with summation of the multiplication results.

Similarly, at time T2, the least significant bits 204, 214, ..., 224 of the inputs (e.g., 280) are applied to the multiplier-accumulator unit 270 to obtain a result 255 of weights (e.g., 250), stored in the memory cell array 273, multiplied by the vector of bits 202, 212, ..., 222 with summation of the multiplication results.

The result 251 generated from multiplication and summation of the most significant bits 201, 211, ..., 221 of the inputs (e.g., 280) can be applied an operation of left shift 261 by one bit; and the operation of add 262 can be applied to the result of the operation of left shift 261 and the result 253 generated from multiplication and summation of the second most significant bits 202, 212, ..., 222 of the inputs (e.g., 280). The operations of left shift (e.g., 261, 263) can be used to apply weights of the bits (e.g., 201, 202, . . . ) for summation using the operations of add (e.g., 262, . . . , 264) to generate a result 267. Thus, the result 267 is equal to the weights (e.g., 250) in the array 273 of memory cells multiplied by the column of inputs (e.g., 280) respectively and then summed.

A plurality of multiplier-accumulator unit 270 can be connected in parallel to operate on a matrix of weights multiplied by a column of multi-bit inputs over a series of time instances T, T1, . . . , T2.

The multiplier-accumulator units (e.g., 270) illustrated in FIG. 4, FIG. 5, and FIG. 6 can be implemented in integrated circuit devices 101 in FIG. 1, FIG. 2, and FIG. 3.

Figure 7:
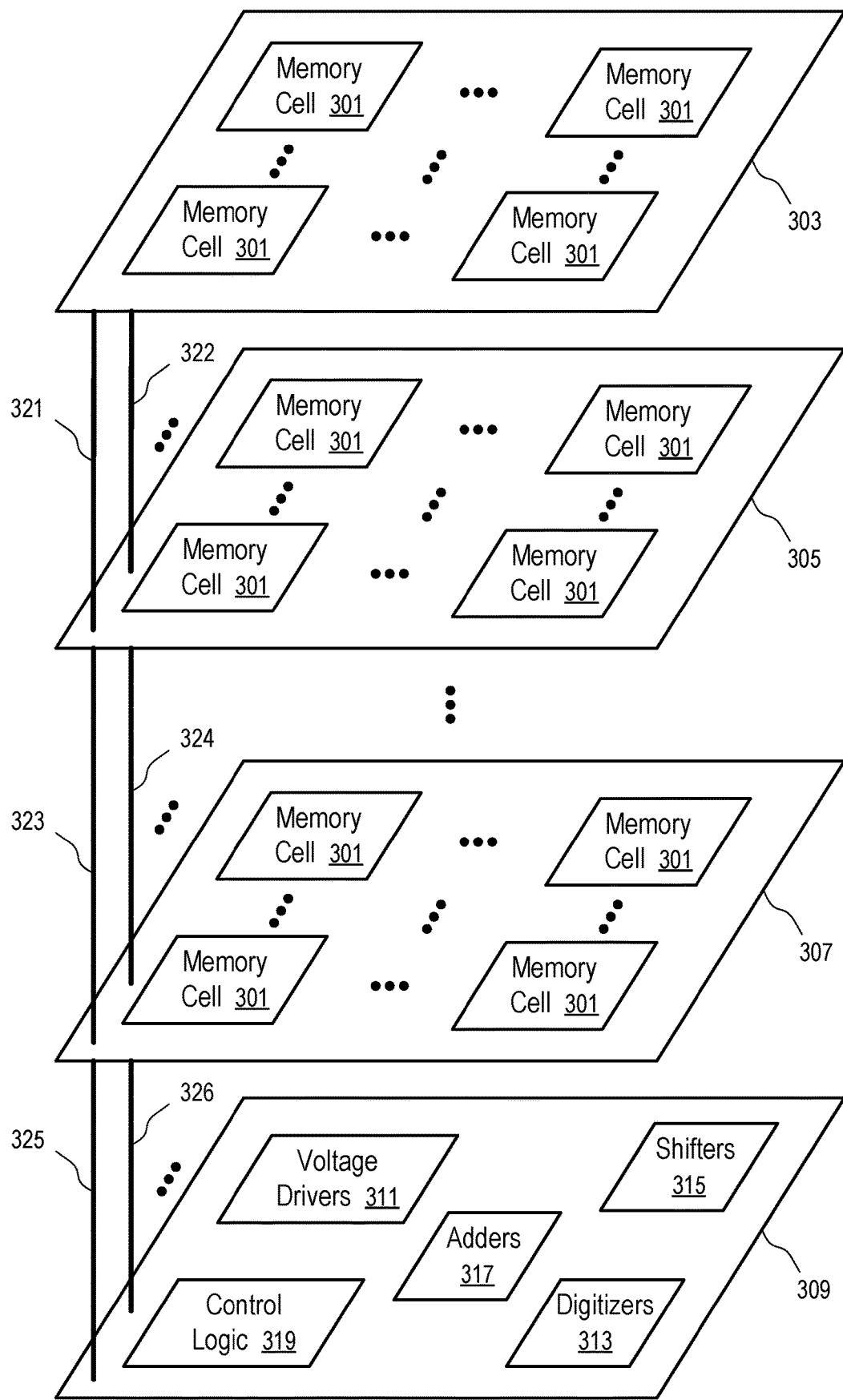
FIG. 7 shows a three-dimensional array of memory cells and circuits to facilitate inference according to one embodiment.

In some implementations, the memory cell array 113 in the integrated circuit devices 101 in FIG. 1, FIG. 2, and FIG. 3 has multiple layers of memory cell arrays as illustrated in FIG. 7.

FIG. 7 shows a three-dimensional array of memory cells and circuits to facilitate inference according to one embodiment.

In FIG. 7, a memory chip (e.g., configured on an integrated circuit die 105 of an integrated circuit device 101 in FIG. 1, FIG. 2, or FIG. 3) is manufactured to have multiple layers 303, 305, . . . , 307 of memory cells 301.

The current outputs of memory cells 301 in a layer (e.g., 303, 305, or 307) can be connected in columns. Each column (e.g., memory cells 207, 217, . . . , 227 as in FIG. 4) is configured for multiplication with a column of input bits (e.g., 201, 211, . . . , 221).

In one implementation, multiple columns configured to store bits of a column of multi-bit weights are configured in a same layer. For example, the memory cells of the array 273 in FIG. 5 can be configured in a layer 303 (or 305). Further, a layer (e.g., 303 or 305) can have multiple memory cell arrays (e.g., 273) to store multiple columns of weights. Thus, the layers 303, 305, . . . , 307 of the memory cells 301 can be used one layer at a time for multiplications and accumulation involving one or more columns of multi-bit weights.

In another implementation, multiple columns configured to store bits of a column of multi-bit weights are distributed into more than one layer. For example, the column of memory cells 207, 217, . . . , 227 for storing the most significant bit 257 of a column of weights can be configured on the layer 303; and the column of memory cells 207, 217, . . . , 227 for storing the least significant bit 259 of the column of weights can be configured on the layer 305 (or layer 307); etc. For example, each significant bit (e.g., 257, 258, or 259) of a weight 250 can be stored in a separate layer from other bits of the weight 250. The layers 303, 305, etc. storing the bits of the weights (e.g., 250) can operate in parallel to perform the multiplication and accumulation computation as in FIG. 5. Optionally, the significant bits (e.g., 257, 258, . . . , 259) of a weight (e.g., 250) can be divided into multiple groups, with each group being stored in a same layer and different groups being stored in different layers. For example, some significant bits (e.g., 257, 258, . . . ) of the weight 250 are stored in a layer 303; and some significant bits (e.g., 259, . . . ) of the weight 250 are stored in another layer 305; etc.

Optionally, the count of layers 303, . . . , 305 in the memory chip can include a multiple of a count of bits (e.g., 257, 258, . . . , 259) in a weight (e.g., 250). Thus, the layers 303, . . . , 305 can be partitioned into multiple subsets. Each of the subsets includes one layer to store one significant bit, or a subset of significant bits, of a weight column. The subsets of the layers 303, . . . , 305 can be used to perform multiplication accumulation operations one subset at a time; and the different subsets can share a set of voltage drivers 271, digitizers 275, shifters 277, and adders 279. Alternatively, the subsets can operation in parallel to perform multiplication and accumulation operations for multiple input bits in parallel; and each subset can have a separate set of voltage drivers 271, digitizers 275, shifters 277, and adders 279.

The memory cells 301 in a layer (e.g., 303) (or a subset of layers) can have sufficient number of columns to store bits for multiple columns of weights. Multiple columns of weights can be stored in one layer, or across multiple layers, for parallel operations with a column of input bits.

Optionally, the columns of memory cells 301 in one or more layers are configured for parallel operation with multiple columns of input bits. For example, a column of memory cells 301 in the layer can have multiple segments; and each segment is configured to store a significant bit of weights to be multiplied by input bits of a respective input vector.

In one implementation, the memory chip (e.g., integrated circuit die 105) includes a layer 309 containing circuits of voltage drivers 311, digitizers 313, shifters 315, and adders 317 to perform the operations of multiplication and accumulation as in FIG. 5. The layer 309 can further include control logic 319 configured to control the operations of the drivers 311, digitizers 313, shifters 315, and adders 317 to perform the operations as in FIG. 5 and FIG. 6. Metal connections 321, 322, . . . , 323, 324, . . . , 325, 326, etc. are configured using metal lines routed within the layers 303, 305, . . . , 307 and 309 and vias through the layers to the voltage drivers 311 and the digitizers 313 in the bottom layer 309. The metal parts in the bottom layer 309 can be connected to the metal parts in the top surface 134 of the integrated circuit die 109 via hybrid bonding to provide a direct bond interconnect 107 to the inference logic circuit 123.

The inference logic circuit 123 can be configured to use the computation capability of the memory chip (e.g., integrated circuit die 105) to perform inference computations of an application, such as the inference computation of an artificial neural network. The inference results can be stored in a portion of the memory cell array 113 for retrieval by an external device via the interface 125 of the integrated circuit device 101.

Optionally, at least a portion of the voltage drivers 311, the digitizers 313, the shifters 315, the adders 317, and the control logic 319 can be configured in the integrated circuit die 109 for the logic chip.

In one implementation, the voltage drivers 311, the digitizers 313, the shifters 315, the adders 317, and the control logic 319 are configured in the integrated circuit die 109. The bottom layer 309 is configured with metal lines to form a direct bond interconnect (e.g., 107 or 108) to the circuits in the logic chip via hybrid bonding.

The memory cells 301 can include volatile memory, or non-volatile memory, or both. Examples of non-volatile memory include flash memory, memory units formed based on negative-and (NAND) logic gates, negative-or (NOR) logic gates, phase-change memory (PCM), magnetic memory (MRAM), resistive random-access memory, cross point storage and memory devices. A cross point memory device can use transistor-less memory elements, each of which has a memory cell and a selector that are stacked together as a column. Memory element columns are connected via two layers of wires running in perpendicular directions, where wires of one layer run in one direction in the layer is located above the memory element columns, and wires of the other layer is in another direction and in the layer located below the memory element columns. Each memory element can be individually selected at a cross point of one wire on each of the two layers. Cross point memory devices are fast and non-volatile and can be used as a unified memory pool for processing and storage. Further examples of non-volatile memory include read-only memory (ROM), programmable read-only memory (PROM), erasable programmable read-only memory (EPROM) and electronically erasable programmable read-only memory (EEPROM) memory, etc. Examples of volatile memory include dynamic random-access memory (DRAM) and static random-access memory (SRAM).

Optionally, the different types of memory cells can be configured on different layers to provide different functions, such as multiplication accumulation computation with weight storage, buffering of intermediate results, and storing results of inference computation for retrieval by an external device via the interface 125.

The integrated circuit die 105 and the integrated circuit die 109 can include circuits to address memory cells 301 in the memory cell array 113, such as a row decoder and a column decoder to convert a physical address into control signals to select a portion of the memory cells 301 for read and write. Thus, an external device can send commands to the interface 125 to write weights (e.g., 250) into the memory cell array 113 and to read results from the memory cell array 113.

In some implementations, the image processing logic circuit 121 can also send commands to the interface 125 to write images into the memory cell array 113 for processing.

Figure 8:
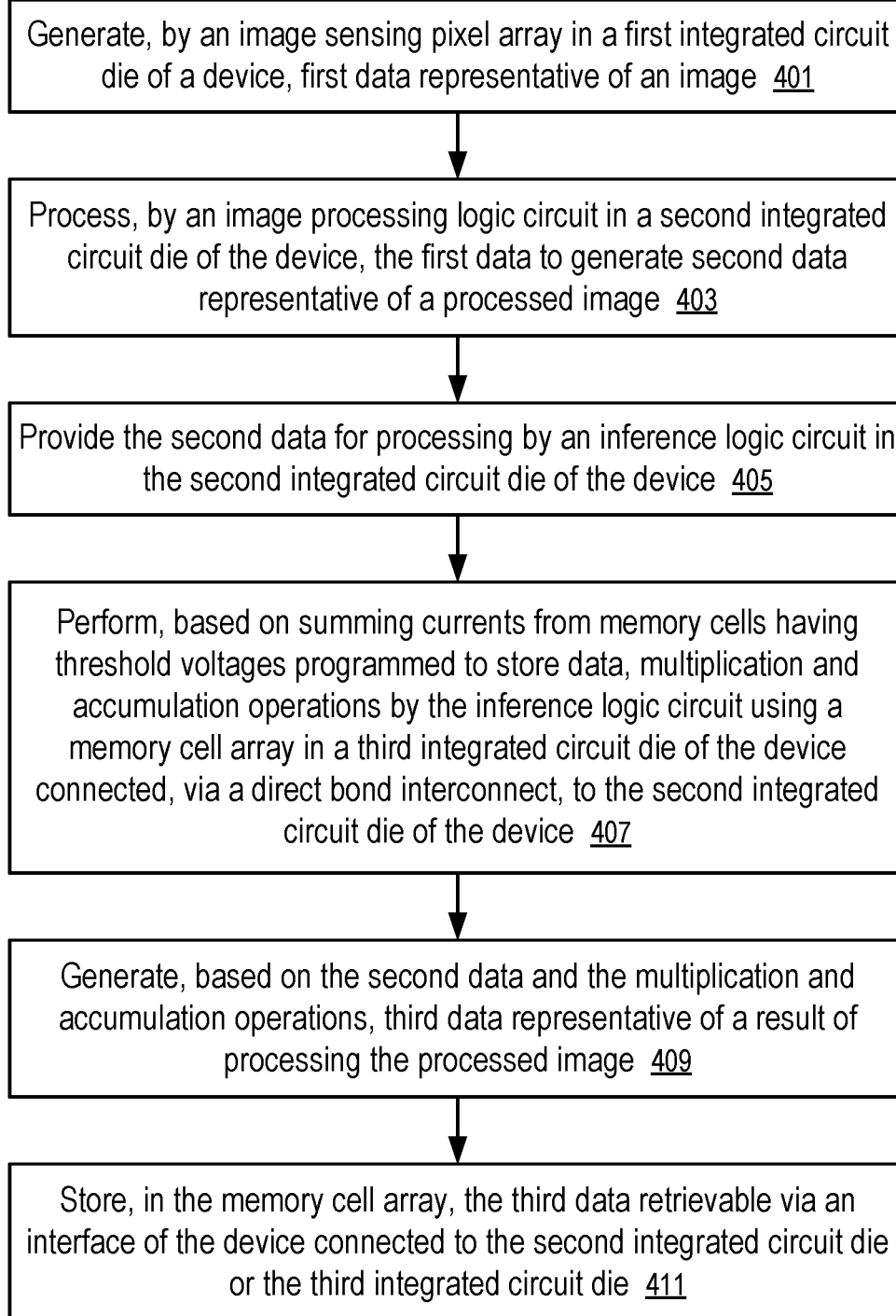
FIG. 8 shows a method of computation in an integrated circuit device according to one embodiment.

FIG. 8 shows a method of computation in an integrated circuit device according to one embodiment. For example, the method of FIG. 8 can be performed in an integrated circuit device 101 of FIG. 1, FIG. 2, or FIG. 3 using multiplication and accumulation techniques of FIG. 4, FIG. 5, and FIG. 6 and memory cells 301 configured in layers as in FIG. 7.

At block 401, an image sensing pixel array 111 in a first integrated circuit die 103 of a device 101 generates first data representative of an image.

At block 403, an image processing logic circuit 121 in a second integrated circuit die 109 of the device 101 processes the first data to generate second data representative of a processed image.

At block 405, the second data is provided within the device 101 as an input for processing by an inference logic circuit 123 in the second integrated circuit die 109 of the device 101.

At block 407, the inference logic circuit 123 performs multiplication and accumulation operations, based on summing currents from memory cells 301 having threshold voltages programmed to store data, using a memory cell array 113 in a third integrated circuit die 105 of the device 101 connected, via a direct bond interconnect 107, to the second integrated circuit die 105 of the device 101.

For example, the device 101 can have a single integrated circuit package configured to enclose the first integrated circuit die 103, the second integrated circuit die 109, and the third integrated circuit die 105.

At block 409, based on the second data and the multiplication and accumulation operations, the inference logic circuit 123 generates third data representative of a result of processing the processed image.

For example, the image processing logic circuit 121 can be configured to write second data into the memory cell array 113 as an input to the artificial neural network; and the inference logic circuit 123 is configured to perform the computations of an artificial neural network using the multiplication and accumulation capability provided via the columns of memory cells in the memory cell array 113.

For example, a column of memory cells 207, 217, . . . , 227 in the memory cell array 113 can have threshold voltages programmed to store a column of weight bits. A column of voltage drivers 203, 213, . . . , 223 can apply, according to a column of input bits 201, 211, . . . , 221, voltages 205, 215, . . . , 225 to the column of memory cells 207, 217, . . . , 227 respectively. Output currents 209, 219, . . . , 229 from the column of memory cells 207, 217, . . . , 227 are summed in an analog form in a line 241. A digitizer 233 converts the summed current 231 in the line 241 as a multiple of a predetermined amount of current 232.

For example, each respective memory cell (e.g., 207, 217, . . . , or 227) in the column of memory cells 207, 217, . . . , 227 can be programmed to have a threshold voltage at: a first level to represent a first value of one; and a second level, higher than the first level, to represent a second value of zero. When applied a predetermined read voltage between the first level and the second level, the respective memory cell (e.g., 207, 217, . . . , or 227) is configured to output the predetermined amount of current 232 when storing the first value of one or to output a negligible amount of current when storing the second value of zero. The resistance of the memory cell (e.g., 207, 217, . . . , or 227) is nonlinear in a voltage range including its threshold voltage.

When a respective input bit (e.g., 201, 211, . . . , or 221) corresponding to the respective memory cell (e.g., 207, 217, . . . , or 227) is zero, the voltage driver 203 connected to the respective memory cell (e.g., 207, 217, . . . , or 227) applies a voltage lower than the first level to the respective memory cell (e.g., 207, 217, . . . , or 227), resulting a negligible amount of current (e.g., 209, 219, . . . , or 229) from the respective memory cell (e.g., 207, 217, . . . , or 227). When the respective input bit (e.g., 201, 211, . . . , or 221) corresponding to the respective memory cell (e.g., 207, 217, . . . , or 227) is one, the predetermined read voltage between the first level and the second level is applied to the respective memory cell (e.g., 207, 217, . . . , or 227), resulting the predetermined amount of current 232 from the respective memory cell (e.g., 207, 217, . . . , or 227) when the respective memory cell (e.g., 207, 217, . . . , or 227) is storing the first value of one, or negligible amount of current when the respective memory cell (e.g., 207, 217, . . . , or 227) is storing the second value of zero.

Optionally, the third integrated circuit die 105 has a plurality of layers 303, 305, . . . , 307, each containing an array of memory cells 301.

The integrated circuit device 101 can have voltage drivers 311, digitizers 313, shifters 315, adders 317, and control logic 319 to perform the multiplication and accumulation operations. In one implementation, the voltage drivers 311, digitizers 313, shifters 315, adders 317, and control logic 319 are configured in a layer 309 of the third integrated circuit die 105. In other implementations, a first portion of the voltage drivers 311, digitizers 313, shifters 315, adders 317, and control logic 319 is configured in a layer 309 of the third integrated circuit die 105; and a second portion of the voltage drivers 311, digitizers 313, shifters 315, adders 317, and control logic 319 is configured in the second integrated circuit die 109. Alternatively, the voltage drivers 311, digitizers 313, shifters 315, adders 317, and control logic 319 are configured in the second integrated circuit die 109.

In some implementations, a subset of the layers 303, 305, ..., 307 can be used together concurrently to perform multiplication and accumulation operations.

For example, most significant bits (e.g., 257) of a column of weights (e.g., 250) are stored in a first column of memory cells 207, 217, ..., 227 in a first layer 303 among the plurality of layers 303, 305, ..., 307; least significant bits (e.g., 259) of the column of weights (e.g., 250) are stored in a second column of memory cells 208, 218, ..., 228 in a second layer 305 (or 307), different from the first layer 303, among the plurality of layers 303, 305, ..., 307; a column of voltage drivers 203, 213, ..., 223 are configured to apply voltages 205, 215, ..., 225 according to a column of input bits 201, 211, ..., 221 to the first column of memory cells 207, 217, ..., 227 and the second column of memory cells 208, 218, ..., 228; a first line 241 is connected to the first column of memory cells 207, 217, ..., 227 to sum output currents 209, 219, ..., 229 from the first column of memory cells 207, 217, ..., 227; a second line 243 is connected to the second column of memory cells 208, 218, ..., 228 to sum output currents from the second column of memory cells 208, 218, ..., 228; a first digitizer 233 is configured to determine a first result 237 from a current 231 in the first line 241 as a multiple of a predetermined amount of current 232; a second digitizer is configured to determine a second result 255 from a current in the second line 243 as a multiple of the predetermined amount of current 232; a shifter 315 is configured to left shift 261 the first result for summation with the second result 255 using an adder 264.

At block 411, the inference logic circuit 123 stores, in the memory cell array 113, the third data retrievable via an interface 125 of the device 101 connected to the second integrated circuit die 109 or the third integrated circuit die 105.

For example, the interface 125 can be operable for a host system to write data into the memory cell array 113 and to read data from the memory cell array 113. For example, the host system can send commands to the interface 125 to write the weight matrices of the artificial neural network into the memory cell array 113 and read the output of the artificial neural network, the raw image data from the image sensing pixel array 111, or the processed image data from the image processing logic circuit 121, or any combination thereof.

In some implementations, both the first integrated circuit die 103 and the third integrated circuit die 105 are connected to the second integrated circuit die 109 via hybrid bonding. Alternatively, the first integrated circuit die 103 can be connected to the second integrated circuit die 109 via microbumps.

The inference logic circuit 123 can be programmable and include a programmable processor, an application-specific integrated circuit (ASIC), or a field-programmable gate array (FPGA), or any combination thereof. Instructions for implementing the computations of the artificial neural network can also be written via the interface 125 into the memory cell array 113 for execution by the inference logic circuit 123.

In one implementation, the second integrated circuit die 109 has an upper surface and a lower surface opposite to the upper surface; the upper surface having a first portion (e.g., surface 132) and a second portion (e.g., surface 134); the first integrated circuit die 103 is configured, attached, or bonded to the second integrated circuit die 109 on the first portion; the third integrated circuit die 105 is configured, attached, or bonded to the second integrated circuit die 109 on the second portion; and the interface 125 is connected to the lower surface of the second integrated circuit die 109, as illustrated in FIG. 1 and FIG. 2.

In another implementation, the second integrated circuit die 109 has an upper surface 132 and a lower surface 133, as illustrated in FIG. 3; the first integrated circuit die 103 is configured, attached, or bonded to the second integrated circuit die 109 on the upper surface 132 (e.g., via microbumps or hybrid bonding); the third integrated circuit die 105 is configured, attached, or bonded to the second integrated circuit die 109 on the lower surface 133 (e.g., via microbumps or hybrid bonding); and the interface 125 is connected to the third integrated circuit die 105, as illustrated in FIG. 3.

In at least some embodiments, the inference capability of the integrated circuit devices 101 is used to perform artificial neural network computations on still images, or video images, or both.

In general, the computation of an artificial neural network includes multiplication and accumulation operations on columns or matrices of data elements. For example, an initial column of inputs can be based on the pixel values of the image received from an image sensor, an image sensing pixel array, an image processing circuit, or a host system. A matrix of weights of the artificial neurons does not change during the computation of the artificial neural network. Thus, such a weight matrix can be stored in one or more layers of the memory cells in the memory chip of the integrated circuit device 101. The multiplication and accumulation operations involving the weight matrix of the artificial neural network can be performed using the memory cell array 113 in the memory chip. The multiplication result can be used to generate a further column of inputs for further multiplication and accumulation with a weight matrix of further artificial neurons. Some computation operations of the artificial neural network, such as the evaluation of the activation functions of artificial neurons, can be implemented using an array of parallel logic circuits configured to operate in parallel to transform a column of weighted inputs to a column of outputs from the set of artificial neurons as a column of inputs to a next set of artificial neurons. Optionally, some activation functions can be configured as iterative or repeated application of one or more weight matrices. The inference logic circuit 123 can be configured to schedule data flow among the logic circuits and multiplier-accumulator units 270 implemented using the memory chip.

Figure 9:
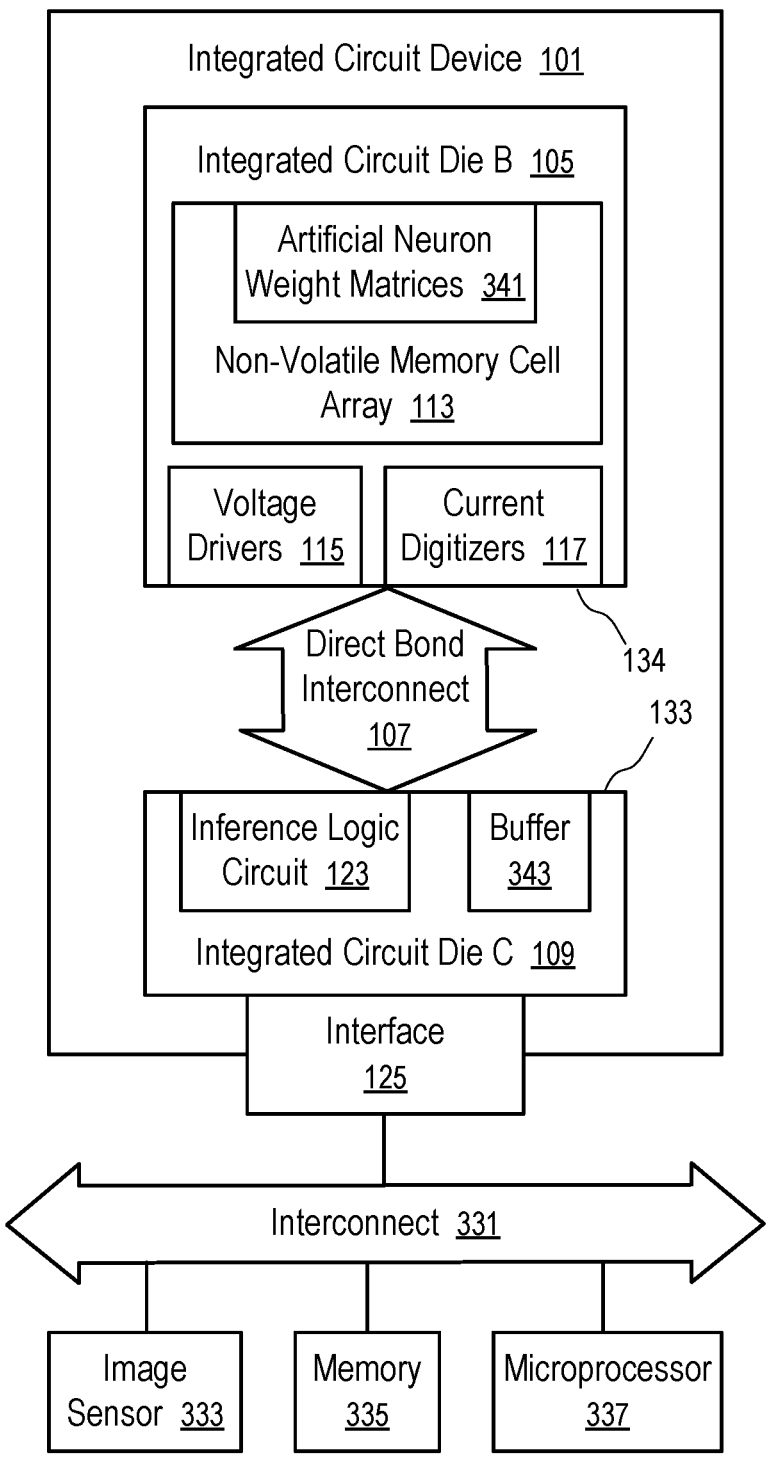
FIG. 9 shows a computing system configured to process an image using an integrated circuit device and an artificial neural network according to one embodiment.

FIG. 9 shows a computing system configured to process an image using an integrated circuit device and an artificial neural network according to one embodiment.

In FIG. 9, an integrated circuit device 101 has a memory chip (e.g., integrated circuit die 105) and a logic chip (e.g., integrated circuit die 109) with variations similar to the integrated circuit devices 101 of FIG. 1, FIG. 2, and FIG. 3. Optionally, the integrated circuit device 101 of FIG. 9 can have an image chip (e.g., integrated circuit die 103) as in FIG. 1, FIG. 2, or FIG. 3. Alternatively, the integrated circuit device 101 of FIG. 9 can be manufactured to have no image chip.

In FIG. 9, the interface 125 of the integrated circuit device 101 can receive commands to write an image into the integrated circuit device 101 as a memory device, or a storage device, or both.

For example, the image sensor 333 can write an image through the interconnect 331 (e.g., one or more computer buses) into the interface 125. Alternatively, a microprocessor 337 can function as a host system to retrieve an image from the image sensor 333, optionally buffer the image in the memory 335, and write the image to the interface 125. The interface 125 can place the image data in the buffer 343 as an input to the inference logic circuit 123.

In some implementations, when the integrated circuit device 101 has an image sensing pixel array 111 (e.g., as in FIG. 1, FIG. 2, and FIG. 3), the image chip or the image processing logic circuit 121 can send image data to the buffer 343 directly, or through the interface 125.

In response to the image data in the buffer 343, the inference logic circuit 123 can generate a column of inputs. The memory cell array 113 in the memory chip (e.g., integrated circuit die 105) can store an artificial neuron weight matrix 341 configured to weight on the inputs to an artificial neural network. The inference logic circuit 123 can instruct the voltage drivers 115 to apply a column of significant bits of the inputs a time to an array of memory cells storing the artificial neuron weight matrix 341 to obtain a column of results (e.g., 251) using the technique of FIG. 5 and FIG. 6. The inference logic circuit 123 can transform the column of results (e.g., according to activation functions of artificial neurons) to generate a next column of inputs to be further weighted on using a further artificial neuron weight matrix 341. The process can continue until a last artificial neuron weight matrix 341 is applied to produce the output of the artificial neural network.

The inference logic circuit 123 can be configured to place the output of the artificial neural network into the buffer 343 for retrieval as a response to, or replacement of, the image written to the interface 125. Optionally, the inference logic circuit 123 can be configured to write the output of the artificial neural network into the memory cell array 113 in the memory chip. In some implementations, an external device (e.g., the image sensor, the microprocessor 337) writes an image into the interface 125; and in response to the integrated circuit device 101 generates the output of the artificial neural network in response to the image and write the output as a replacement of the image into the memory chip.

The memory cells 301 in the memory cell array 113 can be non-volatile. Thus, once the weight matrices 341 are written into the memory cell array 113, the integrated circuit device 101 has the computation capability of the artificial neural network without further configuration or assistance from an external device (e.g., a host system). The computation capability can be used immediately upon supplying power to the integrated circuit device 101 without the need to boot up and configuring the integrated circuit device 101 by a host system (e.g., microprocessor 337 running an operating system). The power to the integrated circuit device 101 (or a portion of it) can be turned off when the integrated circuit device 101 is not used in computing an output of an artificial neural network, and not used in reading or write data to the memory chip. Thus, the energy consumption of the computing system can be reduced.

In some implementations, the inference logic circuit 123 is programmable to perform operations of forming columns of inputs, applying the weights stored in the memory chip, and transforming columns of data (e.g., according to activation functions of artificial neurons). The instructions can also be stored in the non-volatile memory cell array 113 in the memory chip.

In some implementations, the inference logic circuit 123 includes an array of identical logic circuits configured to perform the computation of some types of activation functions, such as step activation function, rectified linear unit (ReLU) activation function, heaviside activation function, logistic activation function, gaussian activation function, multiquadratics activation function, inverse multiquadratics activation function, polyharmonic splines activation function, folding activation functions, ridge activation functions, radial activation functions, etc.

In some implementations, the multiplication and accumulation operations in an activation function is performed using multiplier-accumulator units 270 implemented using memory cells in the array 113.

Some activation functions can be implemented via multiplication and accumulation operations with fixed weights.

Figure 10:
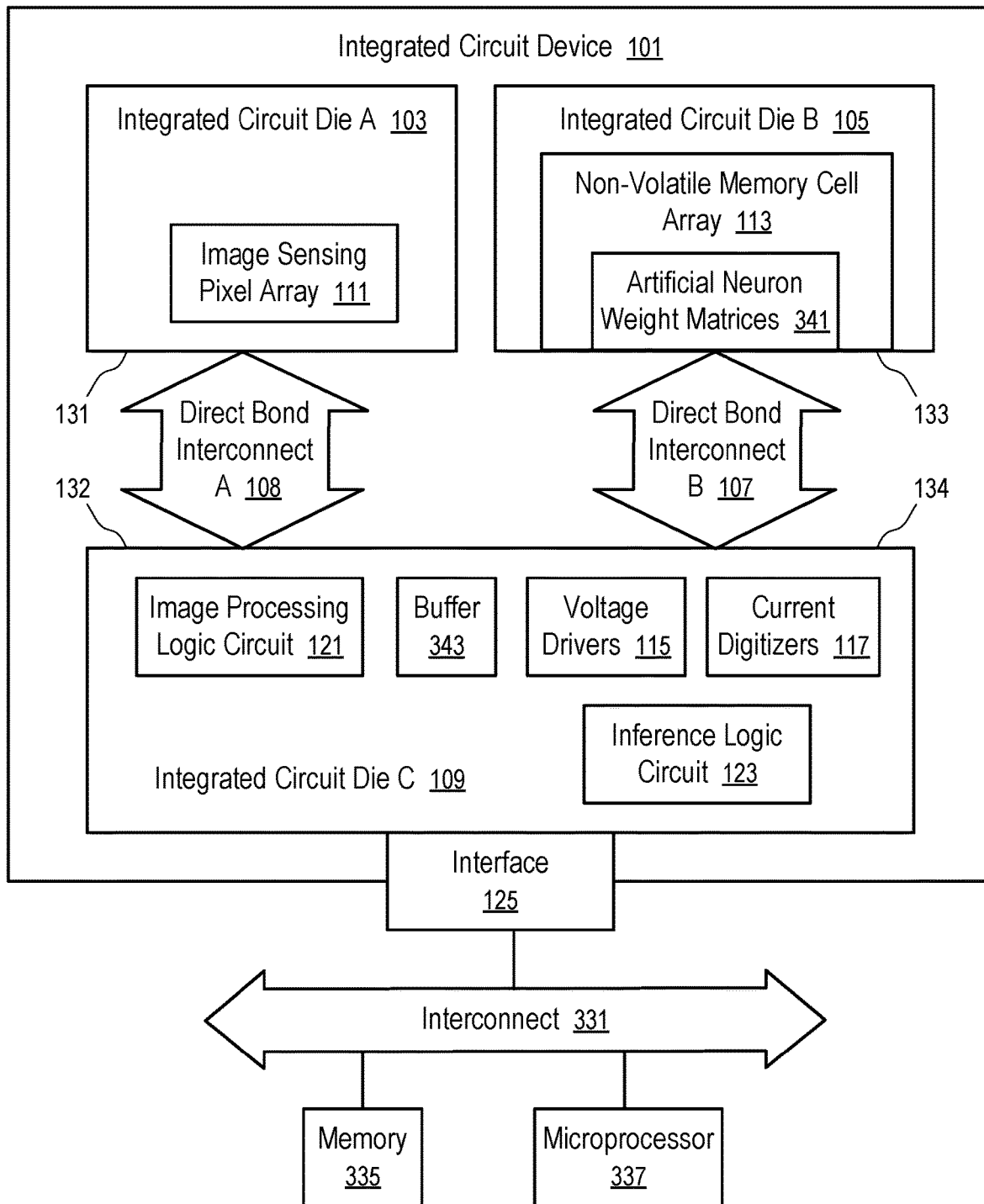
FIG. 10 shows another computing system according to one embodiment.

FIG. 10 shows another computing system according to one embodiment.

The integrated circuit device 101 in FIG. 10 has an integrated circuit die 109 with an inference logic circuit 123 and a non-volatile memory cell array 113 as in FIG. 9.

In FIG. 10, the voltage drivers 115 and the current digitizers 117 are configured in the logic chip (e.g., integrated circuit die 109 having the inference logic circuit 123). Alternatively, at least a portion of the voltage drivers 115 and the current digitizers 117 can be implemented in the memory chip (e.g., integrated circuit die 105 having the memory cell array 113).

In FIG. 10, the integrated circuit device 101 includes an image chip (e.g., integrated circuit die 103 having image sensing pixel array 111).

An image processing logic circuit 121 in the logic chip can pre-process an image from the image sensing pixel array 111 as an input to the inference logic circuit 123. After the image processing logic circuit 121 stores the input into the buffer 343, the inference logic circuit 123 can perform the computation of an artificial neural network in a way similar to the integrated circuit device 101 of FIG. 9.

For example, the inference logic circuit 123 can store the output of the artificial neural network into the memory chip in response to the input in the buffer 343.

Optionally, the image processing logic circuit 121 can also store one or more version of the image captured by the image sensing pixel array 111 in the memory chip as a solid-state drive.

An application running in the microprocessor 337 can send a command to the interface 125 to read at a memory address in the memory chip. In response, the image sensing pixel array 111 can capture an image; the image processing logic circuit 121 can process the image to generate an input in the buffer; and the inference logic circuit 123 can generate an output of the artificial neural network responding to the input. The integrated circuit device 101 can provide the output as the content retrieved at the memory address; and the application running in the microprocessor 337 can determine, based on the output, whether to read further memory addresses to retrieve the image or the input generated by the image processing logic circuit 121. For example, the artificial neural network can be trained to generate a classification of whether the image captures an object of interest and if so, a bounding box of a portion of the image containing the image of the object and a classification of the object. Based on the output of the artificial neural network, the application running in the microprocessor 337 can decide whether to retrieve the image, or the image of the object in the bounding box, or both.

In some implementations, the original image, or the input generated by the image processing logic circuit 121, or both can be placed in the buffer 343 for retrieval by the microprocessor 337. If the microprocessor 337 decides not to retrieve the image data in view of the output of the artificial neural network, the image data in the buffer 343 can be discarded when the microprocessor 337 sends a command the interface 125 to read a next image.

Optionally, the buffer 343 is configured with sufficient capacity to store data for up to a predetermined number of images. When the buffer 343 is full, the oldest image data in the buffer is erased.

When the integrated circuit device 101 is not in an active operation (e.g., capturing an image, operating the interface 125, or performing the artificial neural network computations), the integrated circuit device 101 can automatically enter a low power mode to avoid or reduce power consumption. A command to the interface 125 can wake up the integrated circuit device 101 to process the command.

Figure 11:
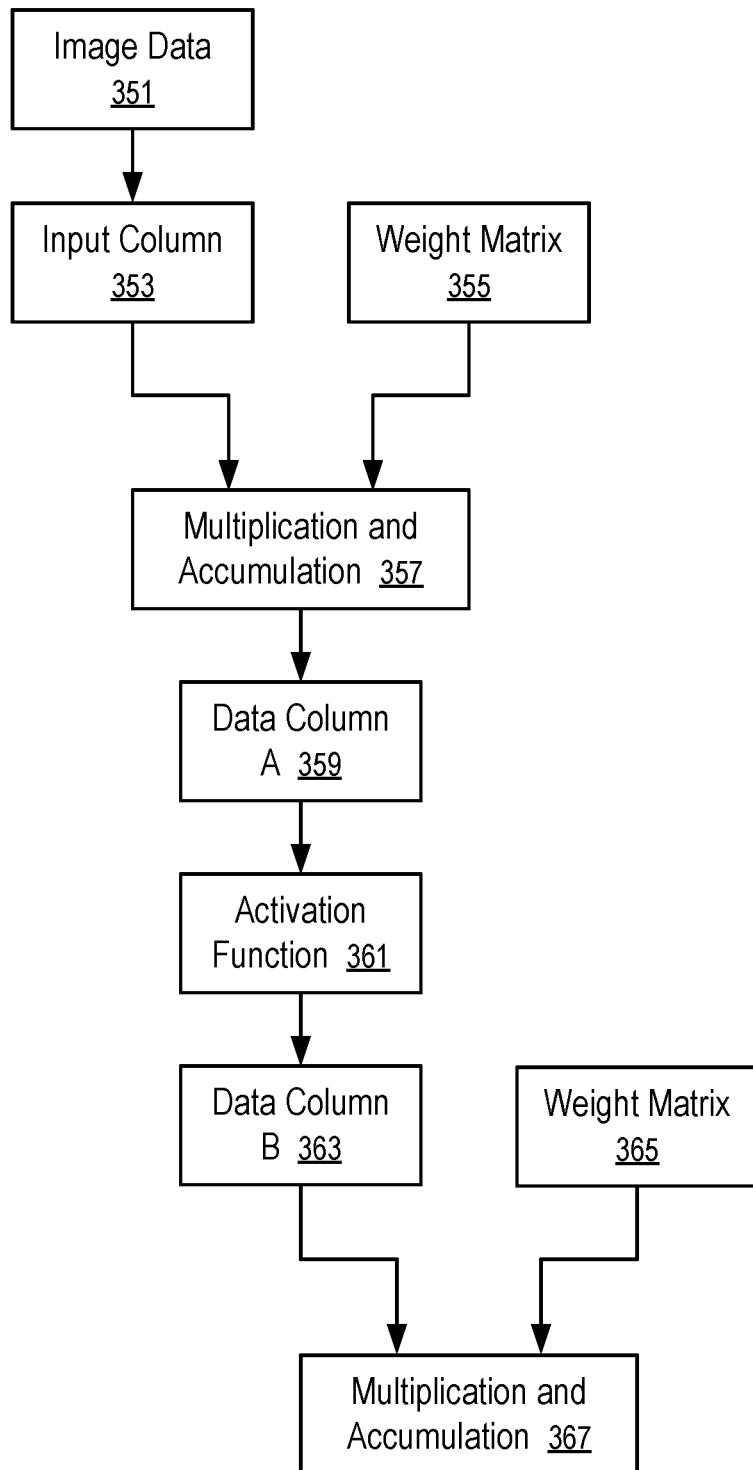
FIG. 11 shows an implementation of artificial neural network computations according to one embodiment.

FIG. 11 shows an implementation of artificial neural network computations according to one embodiment. For example, the computations of FIG. 11 can be implemented in the integrated circuit devices 101 of FIG. 1, FIG. 2, FIG. 3, FIG. 9, and FIG. 10.

In FIG. 11, image data 351 can be provided as an input to an artificial neural network from an image sensing pixel array 111, an image processing logic circuit 121, an image sensor 333, or a microprocessor 337.

An inference logic circuit 123 in an integrated circuit device 101 can arrange the pixel values from the image data 351 into a column 353 of inputs.

A weight matrix 355 is stored in one or more layers (e.g., 303, 305) of the memory cell array 113 in the memory chip of the integrated circuit device 101.

A multiplication and accumulation 357 combined the input columns 353 and the weight matrix 355. For example, the inference logic circuit 123 identifies the storage location of the weight matrix 355 in the memory chip, instructs the voltage drivers 115 to apply, according to the bits of the input column, voltages to memory cells storing the weights in the matrix 355, and retrieve the multiplication and accumulation results (e.g., 267) from the logic circuits (e.g., adder 264) of the multiplier-accumulator units 270 containing the memory cells.

The multiplication and accumulation results (e.g., 267) provide a column 359 of data representative of combined inputs to a set of input artificial neurons of the artificial neural network. The inference logic circuit 123 can use an activation function 361 to transform the data column 359 to a column 363 of data representative of outputs from the next set of artificial neurons. The outputs from the set of artificial neurons can be provided as inputs to a next set of artificial neurons. A weight matrix 365 includes weights applied to the outputs of the neurons as inputs to the next set of artificial neurons and biases for the neurons. A multiplication and accumulation 367 can be performed in a similar way as the multiplication and accumulation 357. Such operations can be repeated from multiple set of artificial neurons to generate an output of the artificial neural network.

Figure 12:
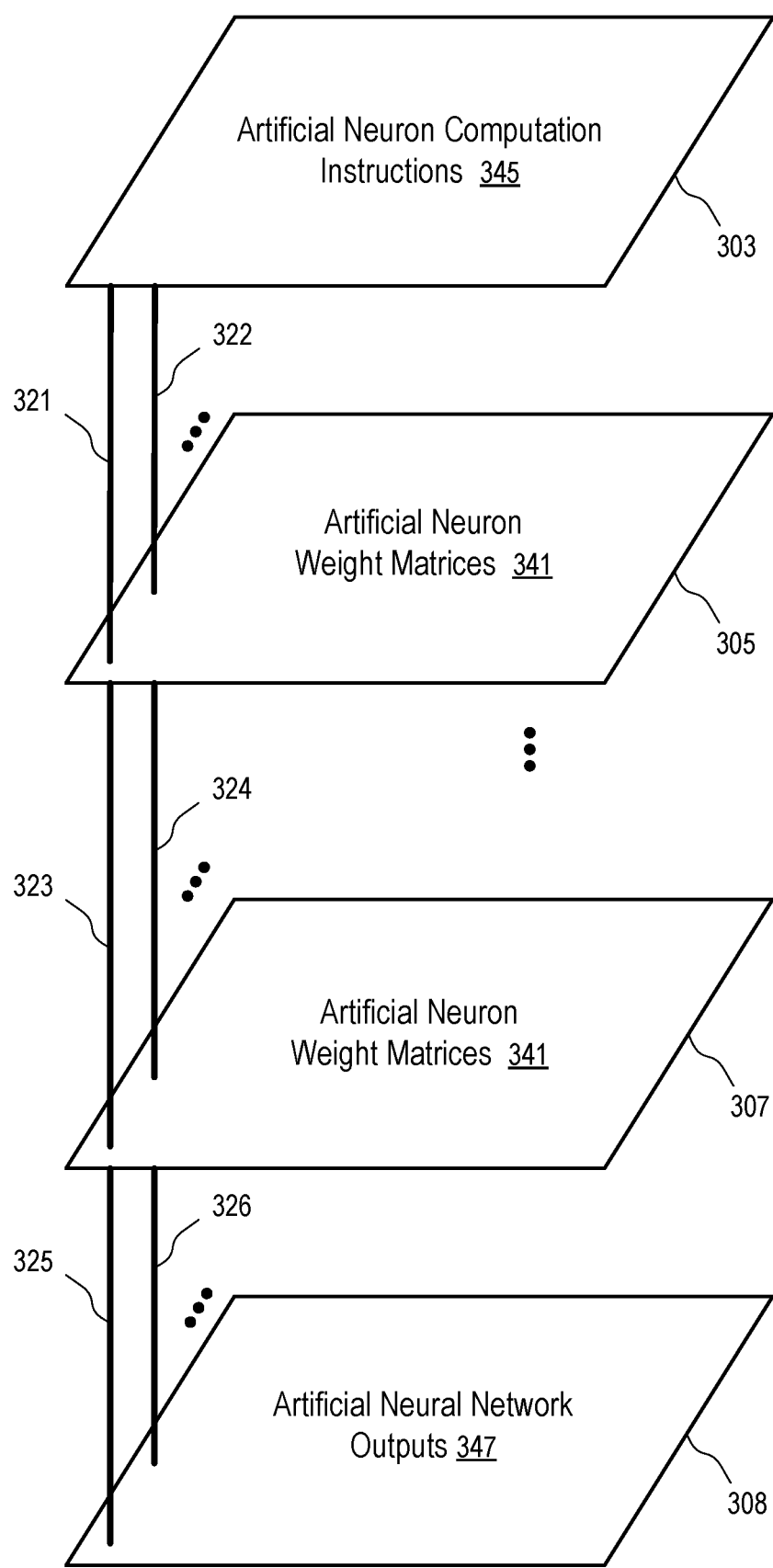
FIG. 12 shows a configuration of layers of a memory cell array in an integrated circuit device for artificial neural network computations according to one embodiment.

FIG. 12 shows a configuration of layers of a memory cell array in an integrated circuit device for artificial neural network computations according to one embodiment. For example, the configuration of FIG. 12 can be implemented in the integrated circuit devices 101 of FIG. 1, FIG. 2, FIG. 3, FIG. 9, and FIG. 10 to perform the computations in FIG. 11.

In FIG. 12, a memory cell array 113 in the memory chip of an integrated circuit device 101 has multiple layers 303, 305, ..., 307, and 309 of memory cells 301, similar to the layers illustrated in FIG. 7.

In FIG. 12, a set of layers 303, ..., 305 can be configured to store the weight matrices 341 (e.g., 355, 365, ...) of artificial neural network computations.

In one implementation, the layers 303, ..., 305 are configured to be used together to store different significant bits of weights. For example, the layer 305 can be configured to store the most significant bits (e.g., in memory cells 207, 217, ..., 227) of weights; and the layer 307 can be configured to store the least significant bits (e.g., in memory cells 208, 218, ..., 228) of weights. Alternatively, the bits of each column of weights are stored in a same layer (e.g., 305 or 307).

The weight matrices 341 (e.g., 355, 365, ...) can have different sizes. For example, any number of weight columns under a predetermined limit can be operated together as a matrix for multiplication and accumulation with a column of input bits. The columns in the memory cell arrays in the weight layers 305, ..., 307 can optionally be partitioned into different column lengths. Thus, one weight matrix 355 can have one count of rows; and another weight matrix 365 can have another count of rows. The weight matrices 355 and 365 can be stored in memory cells in the same columns but different portions of the columns. The layers 305, ..., 307 can be configured to allow different portions of columns to be selected for multiplication and accumulation operations to avoid the need to read an entire column of memory cells 301 in a layer.

In FIG. 12, a layer 307 of the memory cells 301 is configured to store a sequence of instructions to perform the operations illustrated in FIG. 11. The instructions 345 can include the identifications of positions of weight matrices (e.g., 355, 365) in the weight layers 305, ..., 307 and the sizes of the weight matrices (e.g., 355, 365) such that the inference logic circuit 123 can instruct a corresponding portion of voltage drivers 115 to apply voltages according to input bits for the weight matrices (e.g., 355, 365) to generate multiplication and accumulation results (e.g., 267).

In FIG. 12, the image chip includes a layer 308 of memory cells configured to store artificial neural network outputs 347. For example, the outputs 347 generated for a sequence of images can be placed sequentially in the storage space of the layer 308. When the storage space is full, the inference logic circuit 123 can erase the oldest outputs to store the newest outputs in a circular way.

Figure 13:
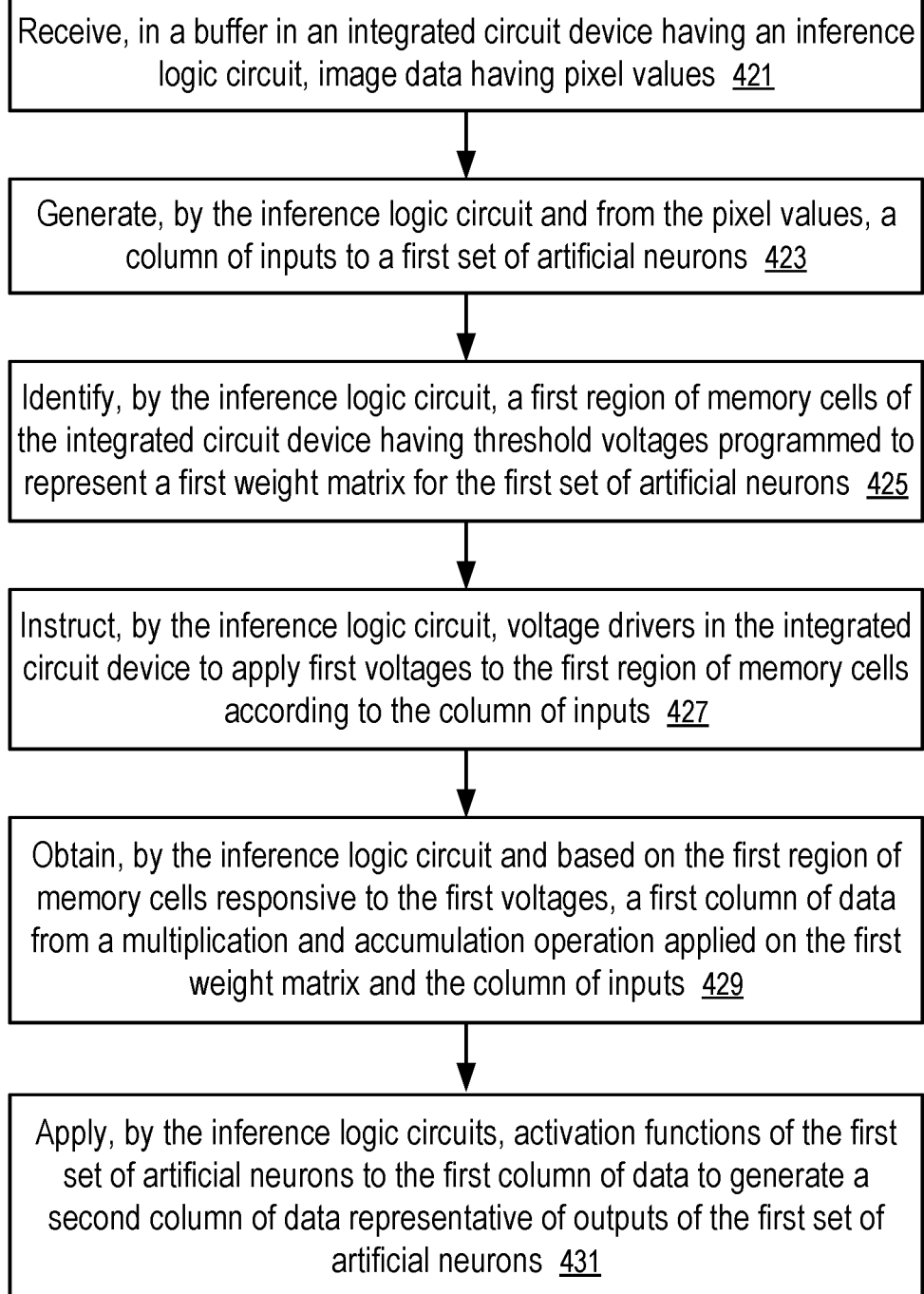
FIG. 13 shows a method of artificial neural network computation according to one embodiment.

FIG. 13 shows a method of artificial neural network computation according to one embodiment. For example, the method of FIG. 13 can be performed to implement computations in FIG. 11 in an integrated circuit device 101 of FIG. 1, FIG. 2, FIG. 3, FIG. 9, or FIG. 10 using multiplication and accumulation techniques of FIG. 4, FIG. 5, and FIG. 6 and memory cells 301 configured in layers as in FIG. 7 and FIG. 12.

At block 421, an integrated circuit device 101 receives, in a buffer 343 image data 351 having pixel values. The integrated circuit device 101 has an inference logic circuit 123 configured in a logic chip (e.g., integrated circuit die 109).

The buffer 343 can be configured in the logic chip or a memory chip (e.g., integrated circuit die 105) of the integrated circuit device 101. The buffer 343 can be implemented using a volatile memory (e.g., dynamic random-access memory (DRAM) and static random-access memory (SRAM)); and a memory cell array 113 in the memory chip can implement non-volatile memory cells 301 (e.g., NAND memory, NOR memory, flash memory, cross point memory).

Optionally, the integrated circuit device 101 can have an image sensor chip (e.g., integrated circuit die 103) having an image sensing pixel array 111. The integrated circuit device 101 can have a single integrated circuit package enclosing the logic chip, the memory chip, and the optional image sensor chip.

The integrated circuit device 101 can have an interface to receive the image data 351 from an external device (e.g., an image sensor 333, or a microprocessor 337). In some implementations, when the integrated circuit device 101 has an image sensor chip, an image processing logic circuit 121 in the logic chip can generate the image data in the buffer 343 based on an image captured by the image sensing pixel array 111.

The integrated circuit device 101 can have voltage drivers 115 configured in the logic chip or the memory chip to read data from and write data into the memory chip. The memory chip and the logic chip can be connected via heterogeneous direct bonding.

At block 423, in response to the image data 351 in the buffer 343, the inference logic circuit 123 generates, from the pixel values of the image data 351, a column 353 of inputs to a first set of artificial neurons in an artificial neural network.

At block 425, the inference logic circuit 123 identifies a first region of memory cells 301 of the integrated circuit device 101 having threshold voltages programmed to represent a first weight matrix 355 for the first set of artificial neurons.

In some implementations, the first region of memory cells 301 can be in a plurality of layers 305, ..., 307 of the memory chip. For example, significant bits (e.g., 257, 258, ..., 259) of a weight 250 in the first weight matrix 355 can be stored on different layers 305, ..., 307 that are operable in parallel to perform an operation of multiplication and accumulation 357. Alternatively, the first weight matrix 355 can be stored in a single layer (e.g., 305 or 307) of the memory chip.

At block 427, the inference logic circuit 123 instructs voltage drivers 115 in the integrated circuit device 101 to apply first voltages (e.g., 205, 215, ..., 225) to the first region of memory cells 301 according to the column 353 of inputs.

For example, the inference logic circuit 123 provides input bits 201, 211, ..., 221 to the voltage drivers 203, 213, ..., 223 to apply the first voltages (e.g., 205, 215, ..., 225) onto rows of memory cells in the first region. The memory chip connects output currents (e.g., 209, 219, ..., 229) from columns of memory cells in the first region to a plurality of lines (e.g., 241, 242, ..., 243). A set of digitizers (e.g., 233) are connected to the lines (e.g., 241) to digitize currents (e.g., 231) in the plurality of lines (e.g., 241) as multiple of a predetermined amount of current (e.g., 232) to obtain the first column 359 of data.

For example, applying the first voltages (e.g., 205, 215, ..., 225) can include: applying a predetermined read voltage to a row of memory cells in the first region in response to a first significant bit (e.g., 201) of an input (e.g., 280) in the column 353 of inputs having a first value of one; and skipping application of the predetermined read voltage to the row of memory cells in the first region in response to a second significant bit (e.g., 202) of the input (e.g., 280) in the column 353 of inputs having a second value of zero.

For example, the applying of the predetermined read voltage is performed in a first period of time T; and the skipping of the application of the predetermined read voltage is performed in a second period of time T1 separate from the first period of time T1.

To store the weight matrix 355 in memory cells 301 in the memory chip, the voltage drivers 115 can be used to apply programming voltage pulses to adjust or program a threshold voltage of each respective memory cell 301 in the first region. The threshold voltage is programmed to a first level below or near the predetermined read voltage to store a significant bit (e.g., 257) of a weight (e.g., 250) in the first region in response to the significant bit (e.g., 257) having the first value of one, or to a second level above the predetermined read voltage to store the significant bit (e.g., 257) in response to the significant bit (e.g., 257) having the second value of zero. The respective memory cell is configured to, when the threshold voltage of the respective memory cell is programmed to the first level, output the predetermined amount of current when applied the predetermined read voltage. Each respective memory cell in the layers 305, ..., 307 for storing the weight matrices 341 is configured to output: the predetermined amount of current in response to the predetermined read voltage when the respective memory cell has a threshold voltage programmed to represent a value of one; or a negligible amount of current in response to the predetermined read voltage when the threshold voltage is programmed to represent a value of zero or in absence of the predetermined read voltage.

At block 429, the inference logic circuit 123 obtains, based on the first region of memory cells 301 responsive to the first voltages (e.g., 205, 215, ..., 225), a first column 359 of data from an operation of multiplication and accumulation 357 applied on the first weight matrix 355 and the column 353 of inputs.

At block 431, the inference logic circuits 123 applies activation functions 361 of the first set of artificial neurons to the first column 359 of data to generate a second column 363 of data representative of outputs of the first set of artificial neurons.

The second column 363 of data can be used as an input to a next set artificial neurons; and the operations in block 425 to 431 can be repeated to perform the computations of the next set of artificial neurons.

For example, the inference logic circuit 123 identifies a second region of memory cells 301 of the integrated circuit device 101 having threshold voltages programmed to represent a second weight matrix 365 for the second set of artificial neurons. The inference logic circuit 123 instructs voltage drivers 115 in the integrated circuit device 101 to apply second voltages to the second region of memory cells 301 according to the second column 363 of data. The inference logic circuit 123 obtains, based on the second region of memory cells responsive to the second voltages, a third column of data from an operation of multiplication and accumulation 367 applied on the second weight matrix 365 and the second column 363 of data. The inference logic circuits 123 applies activation functions of the second set of artificial neurons to the third column of data to generate a fourth column of data representative of outputs of the second set of artificial neuron.

After the inference logic circuit 123 obtains outputs 347 of a set of output artificial neurons of the artificial neural network, the inference logic circuit 123 can store the outputs 347 in the buffer or in a layer 308 of memory cells 301 in the memory chip as a result of the artificial neural network responding to the pixel values of the image data 351 as an input.

Optionally, the inference logic circuit 123 is programmable. The inference logic circuit 123 can read a region of memory cells 301 of the integrated circuit device 101 to retrieve instructions 345 to process the image data 351 using the memory cells 301 storing the weight matrices 341 of the artificial neural network, including the first region of memory cells storing the first weight matrix 355 and the second region of memory cells storing the second weight matrix 365.

In some implementations, a portion of the instructions 345 is configured to instruct the inference logic circuit 123 to perform the computations of the activation functions 361, and determine the sizes and storage locations of the weight matrices (e.g., 355, 365) for various operations of multiplication and accumulation (e.g., 357, 367).

Optionally, the inference logic circuit 123 can be configured to perform at least a portion of computations of the activation functions 361 of the first set of artificial neurons using a third weight matrix stored in a region of memory cells 301 of the integrated circuit device 101.

Optionally, the inference logic circuit 123 is configured to perform computations of the activation functions 361 of the first set of artificial neurons using a plurality of parallel sets of logic circuits of the inference logic circuit 123.

Threshold voltages of memory cells 301 in the memory cell array 113 are programmable in a mode for use as synapse memory cells and programmable in another mode for use as storage memory cells. Synapse memory cells can be used as part of multiplier-accumulator units 270 as illustrated in FIG. 4, FIG. 5, and FIG. 6. Typical storage memory cells are programmed in alternative modes and thus not usable as part of multiplier-accumulator units 270 as illustrated in FIG. 4, FIG. 5, and FIG. 6.

Although it is possible to program the threshold voltages of memory cells in a same way as synapse memory cells to store data without the memory cells being used in multiplier-accumulator units 270, it is generally advantageous to program the threshold voltages of storage memory cells in alternative ways for enlarged storage capacity, improved writing performance, improved reliability in reading, etc.

For example, FIG. 4, FIG. 5, and FIG. 6 illustrates synapse memory cells (e.g., 207, 217, ..., 227) in an array 273 being programmed to store one bit (e.g., 257) of a weight (e.g., 250) per memory cell (e.g., 207) to function in a multiplier-accumulator unit 270. However, when the same memory cell 207 in the array 273 is used to store data without the need to support the operations of multiplication and accumulation, the threshold voltage of the memory cell 207 can be programmed to represent multiple bits. For example, when used as a storage memory cell, the memory cell 207 can be programmed in a multi-level cell (MLC) mode to store two bits, a triple level cell (TLC) mode to store three bits, a quad-level cell (QLC) mode to store four bits, or a penta-level cell (PLC) mode to store five bits, to significantly increase the storage capacity of the memory cell 207. Optionally, the memory cell 207 can be programmed in a single level cell (SLC) to store one bit to extend the budget of erasing and programming the memory cell 207 and to increase the speed in programming the memory cell 207 for storing data.

Typically, memory cells used as storage memory cells in the array 113 are programmed in ways different from the programming of synapse memory cells. The synapse memory cells are programmed in a first mode (e.g., synapse mode) to facilitate operations of multiplication and accumulation, while the storage memory cells are programmed in a second mode (e.g., storage mode) for enhanced benefits in reading and writing. As a result of being programmed for enhanced benefits in reading and writing, the storage memory cells programmed in the second mode cannot support the operations of multiplication and accumulation as illustrated in FIG. 4, FIG. 5, and FIG. 6.

For example, memory cells programmed in the first mode can be used as synapse memory cells in multiplier-accumulator units 270. An array 273 of synapse memory cells storing a weight matrix 341 can be used in the multiplier-accumulator units 270 by concurrently reading rows of memory cells connected on a plurality of wordlines 281, 282, ..., 283 according to bits of a column of inputs (e.g., 280).

For example, a respective memory cell 301 in the memory cell array 113 is configured to store one bit per cell, when programmed in the first mode.

For example, a respective memory cell 301 in the memory cell array 113 is configured to output, when programmed in the first mode and in response to a predetermined read voltage representative of an input bit having a value of one, into a bitline either a predetermined amount of current 232 to represent a value of one stored in the respective memory cell 301, or a negligible amount of current to represent a value of zero stored in the respective memory cell 301.

In contrast, the respective memory cell 301 in the memory cell array 113 can alternatively be programmed in the second mode to function as a storage memory cell.

For example the respective memory cell 301 in the memory cell array 113 can be configured to store more than one bit per cell, when programmed in the second mode. For example, the threshold voltage of the respective memory cell 301 can be programmed to one of a plurality of voltage regions used to represent a plurality of values respectively.

The respective memory cell 301 in the memory cell array 113 is configured to output, when programmed in the second mode and in response to a lower read voltage of a voltage region representing a value among the plurality of values, a negligible amount of current and to output, when programmed in the second mode and in response to a higher read voltage of the voltage region, more than a threshold amount of current.

The inference logic circuit 123 can use the voltage drivers 115 to apply voltages onto wordlines (e.g., 281, 282, ..., 283) connected to synapse memory cells (e.g., 207, 217, ..., 227; 206, 216, ..., 226; ...; 208, 218, ..., 228) in the array 113 to generate summed currents (e.g., 231) in bitlines (e.g., 241, 242, ..., 243). The current digitizers 117 can convert the summed currents (e.g., 231) to column outputs (e.g., results 237, 236, ..., 238). The shifters 277 and adders 279 can further process the column outputs to generate results (e.g., 251, 267) of multiplication and accumulation in the computation of an artificial neural network and in other types of computations, such as image compression, image enhancement, etc.

The inference logic circuit 123 can perform operations of multiplication and accumulation using the voltage drivers 115 and current digitizers 117 to read the weight matrix 341 according to bits of an input column (e.g., 353). When an input bit (e.g., 201) has a value of zero, a row of memory cells (e.g., 207, 206, ..., 208) connected to a wordline driven by the voltage driver (e.g., 203) controlled by the input bit (e.g., 201) are not read; and thus the memory cells connected to the wordline output negligible amount of currents into bitlines (e.g., lines 241, 242, ..., 243). When an input bit (e.g., 201) has a value of one, a row of memory cells (e.g., 207, 206, ..., 208) connected to a wordline driven by the voltage driver (e.g., 203) controlled by the input bit (e.g., 201) are read; and thus each of the memory cells connected to the wordline outputs a predetermined amount of current 232 into bitlines (e.g., lines 241, 242, . . . , 243). The input bits can have multiple bits that have values of one, which can cause multiple rows/wordlines to be read concurrently at the same time for summing as output currents in bitlines to obtain the column outputs (e.g., results 237, 236, . . . , 238) through the current digitizers 117. The shifters 277 and the adders 279 can combine column outputs for different significant bits of inputs (e.g., 280) and weights (e.g., 250), as in FIG. 5 and FIG. 6, to generate the results (e.g., 251, 267) of multiplication and accumulation operations.

In at least some embodiments, an integrated circuit device 101 is configured with a mechanism to check the calibration of synapse memory cells (e.g., 207, 217, . . . , 227) in producing the correct amounts of output currents (e.g., 209, 219, . . . , 229) for operations of multiplication and accumulation.

A synapse memory cell (e.g., 207) having a threshold voltage programmed at a temperature to output the predetermined amount of current 232 to represent a weight bit of one can output a different amount of current, when the memory cell (e.g., 207) is operated at a temperature different from the temperature of programming the threshold voltage.

In general, the threshold voltage of a synapse memory cell (e.g., 207) can drift under various conditions. For example, read disturb can occur to a memory cell and move its threshold voltage when its neighboring memory cell is applied a read voltage during a read operation. Accumulated read disturbs can cause the threshold voltage of a synapse memory cell to drift significantly and corrupt the weight programming of the synapse memory cell, resulting in errors in operations of multiplication and accumulations.

When the calibration of the amounts of current generated by synapse memory cells is off or incorrect due to various factors (e.g., environmental changes, read disturbs), the synapse memory cells can output currents in amounts different from the expected amounts (e.g., the predetermined amount of current 232, a negligible amount of current). The deviation of the output currents from the expected amounts can also be summed and accumulated in a bitline. For example, when the deviations of the output currents 209, 219, . . . , 229 of synapse memory cells 207, 217, . . . , 227 connected to a line 241 are significant, the accumulated deviations in the summed current 231 in the line 241 can result in an erroneous result 237 when the digitizer 233 converts the summed current 231 as a multiple of the predetermined amount of current 232.

To check the calibration of the synapse memory cells 301 storing weight matrices 341, the integrated circuit device 101 can be configured to apply a known input to a layer (e.g., 305) of synapse memory cells 301 and obtain a result of multiplication and accumulation. The integrated circuit device 101 can store a known result for the calibration operation. The integrated circuit device 101 can be configured to compare the known result and the result computed using the layer (e.g., 305) of synapse memory cells 301 to determine whether the calibration of the amounts of output currents of the synapse memory cells is off. When the results do not match with each other, the integrated circuit device 101 can refresh or reprogram the weights of the synapse memory cells until the synapse memory cells have the correct calibration.

Optionally, the integrated circuit device 101 can be configured to perform the calibration check at regular intervals and when the inference logic circuit 123 is idle. The calibration check can be suspended if there is a request for the inference logic circuit 123 to perform inference computations, and can resume after completion of pending requests.

Optionally, the integrated circuit device 101 can have a register that can be set by a host system (e.g., a microprocessor 337 connected to the integrated circuit device 101) to selectively enable or disable automatic calibration check and when enabled, to specify the time interval of calibration checks. Further, the host system can specify data to be used in calibration checks, such as known inputs and known results. Alternatively, the host system can specify the conditions to trigger an automatic calibration check. For example, a calibration check can be performed in response to a change of environment temperature (or the operating temperature of the integrated circuit device 101) being more than a threshold from a temperature specified by the host system.

Optionally, the integrated circuit device 101 can perform a calibration check in response to a request from the host system. In response the integrated circuit device 101 can suspend services of inference computations until the calibration of the synapse memory cells is confirmed to be correct.

Calibration checks can ensure the reliability of the synapse memory cells in operations of multiplication and accumulation, such as in the computations of an artificial neural network, especially when the integrated circuit device 101 is used in applications where the synapse memory cells can experience extreme temperatures.

Figure 14:
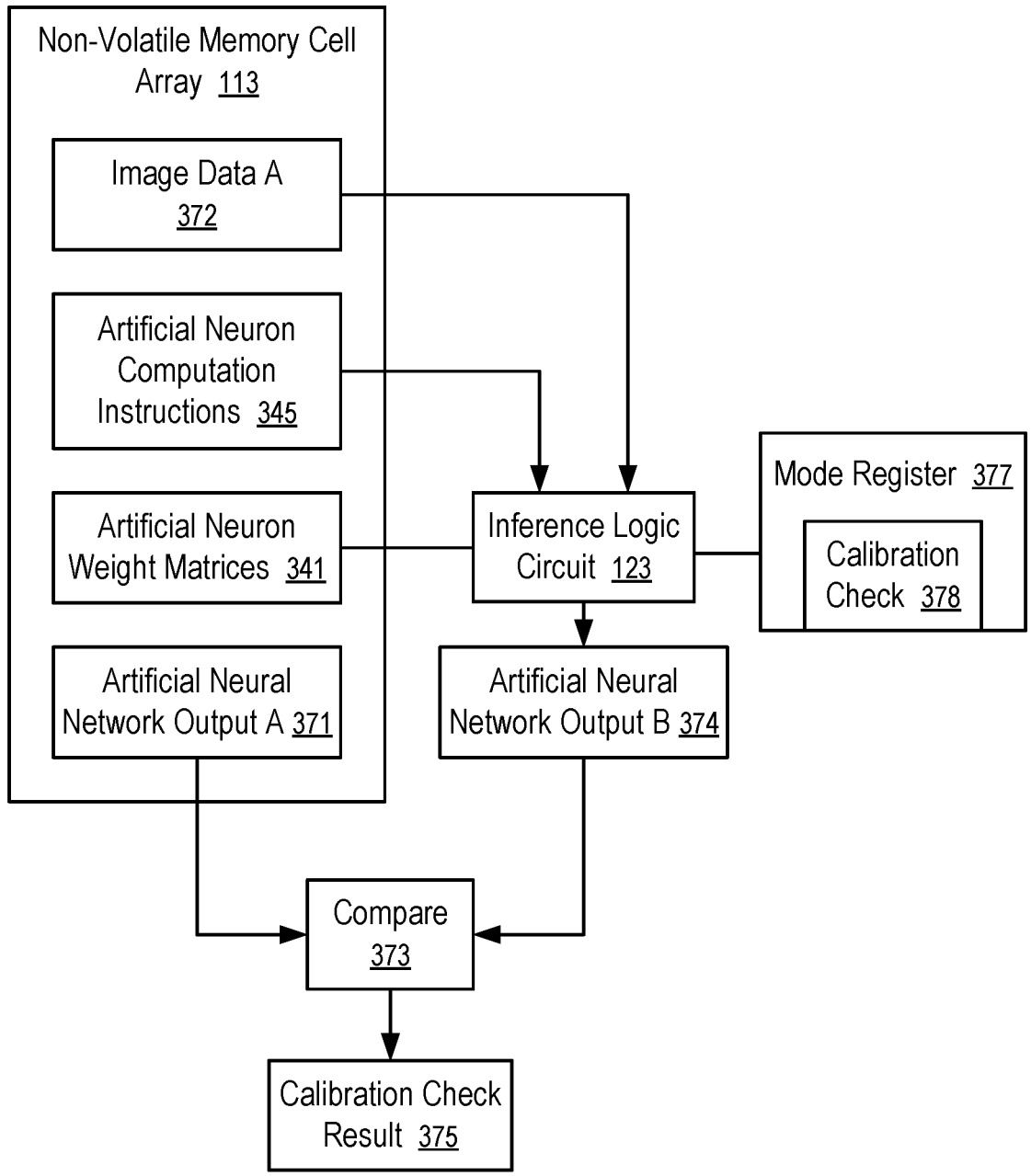
FIG. 14 shows a technique of checking calibration of weight programming of memory cells for operations of multiplication and accumulation according to one embodiment.

FIG. 14 shows a technique of checking calibration of weight programming of memory cells for operations of multiplication and accumulation according to one embodiment. For example, the technique of FIG. 14 can be implemented in the integrated circuit devices 101 of FIG. 1, FIG. 2, FIG. 3, FIG. 9, and FIG. 10.

In FIG. 14, an integrated circuit device 101 can have a mode register 377 configured to store data identifying whether the integrated circuit device 101 is currently in the mode of performing a calibration check 378.

The memory cell array 113 in the integrated circuit device 101 has a portion of memory cells programmed in a synapse mode to store artificial neuron weight matrices 341 of an artificial neural network. The memory cell array 113 has another portion of memory cells programmed in a storage mode to store artificial neuron computation instructions 345, sample image data 372, and a sample artificial neural network output 371 known to have been computed correctly from the sample image data 372 according to the artificial neural network.

When the mode register 377 identifies a calibration check 378, the inference logic circuit 123 can automatically apply the image data 372 to the artificial neuron weight matrices 341 according to the artificial neuron computation instructions 345. As illustrated in FIG. 11, the inference logic circuit 123 uses the synapse memory cells storing the artificial neuron weight matrices 341 to perform the operations of multiplication and accumulation in the computations of the artificial neural network. After the inference logic circuit 123 obtains a computed artificial neural network output 374, the integrated circuit device 101 can compare 373 the known artificial neural network output 371 and the computed artificial neural network output 374 to generate a calibration check result 375.

For example, when the known artificial neural network output 371 and the computed artificial neural network output 374 agree with each other, the calibration check result 375 can indicate that the calibration of the characteristics of output currents of the synapse memory cells storing the artificial neuron weight matrices 341 is correct and intact. Otherwise, the calibration of the characteristics of output currents of the synapse memory cells storing the artificial neuron weight matrices 341 is off and corrupted.

If the calibration of the characteristics of output currents of the synapse memory cells storing the artificial neuron weight matrices 341 is off and corrupted, the integrated circuit device 101 can apply voltage pulses to the synapse memory cells to refresh or reprogram the weight programming of the synapse memory cells. After the refreshing or reprogramming operations, the calibration check can be repeated to confirm the success of refreshing or reprogramming.

In some implementations, the mode register 377 can further specify a time interval. After the lapsed time since the last calibration check is longer than the time interval, the integrated circuit device 101 can automatically check whether the inference logic circuit 123 and the artificial neuron weight matrices 341 are in use. If not, the integrated circuit device 101 can automatically set the mode register 377 to identify a calibration check 378.

During the calibration check 378, the integrated circuit device 101 can be requested to use the inference logic circuit 123 to perform an operation of multiplication and accumulation, such as the computation of the artificial neural network. If such a request is received, the integrated circuit device 101 can optionally suspend or cancel the calibration check 378.

Optionally, the mode register 377 can further specify a further time interval. After the further time interval from a previous calibration check, a calibration check 378 can become mandatory; and the integrated circuit device 101 can pause further services requests for the inference logic circuit 123 until the calibration is confirmed.

In some implementations, the mode register 377 can further specify an operation condition, such as a temperature condition, for triggering a calibration check. For example, the current operating condition of the integrated circuit device 101 can satisfy the temperature condition when the current operating temperature has a temperature offset, from a given temperature, that is more than a threshold. In response the integrated circuit device 101 can start a calibration check 378. For example, the given temperature can be the operating temperature of last refreshing or reprogramming the synapse memory cells to store the artificial neural weight matrices 341, or a predetermined temperature that is independent from operations of the integrated circuit device 101.

Optionally, the memory cell array 113 can store multiple sets of sample image data 372 and their respective known outputs 371 from the artificial neural network responding to the sets of sample image data 372 respectively. The integrated circuit device 101 can randomly select a set, from the multiple sets of sample image data 372, to perform the calibration check 378.

Optionally, the sample image data 372 can be the image data 351 previously captured by the image sensor 333 connected to the integrated circuit device 101 or the image sensing pixel array 111 of the integrated circuit device 101. When the processing of the image data 351 to generate its corresponding output 371 is performed at a condition with a high confidence level that the artificial neuron weight matrices 341 are corrected calibrated for the computation, the output 371 can be considered correct and usable in calibration checks. For example, when the computation to obtain the output 371 is performed at a temperature that is within a predetermined temperate range from the temperature of latest reprogramming or refreshing of the synapse memory cells and at a time gap from the reprogramming or refreshing that is smaller than a threshold for time gaps, the synapse memory cells storing the artificial neuron weight matrices 341 can be considered to have correct calibration; and the output 371 can be considered correct and usable for calibration.

Optionally, some of the sample artificial neural network outputs 371 available for calibration checks 378 are computed using the inference logic circuit 123, as discussed above; and others are computed in a separate, reliable device and provided to the integrated circuit device 101 for calibration checks.

In FIG. 11, the computations of an artificial neural network includes the evaluation of activation functions 361 that can be implemented in some integrated circuit devices 101 without using synapse memory cells. Thus, the calibration check 378 can be performed without performing the computations of the activation functions 361.

For example, the integrated circuit device 101 can store sample input columns 353 and data columns 363 and the corresponding known output data columns (e.g., 359) generated from operations of multiplications and accumulation (e.g., 357 and 367). Thus, the inference logic circuit 123 can perform the operations of multiplications and accumulation (e.g., 357 and 367) using the sample inputs and the corresponding weight matrices (e.g., 355 and 365) to obtain computed data columns (e.g., 359). Calibration check results 375 can be obtained separately for weight matrices (e.g., 355 and 365) based on comparison of their known output data columns and their respective computed output data columns.

Optionally, the calibration check 378 can be performed for an entire layer (e.g., 305 or 307) of synapse memory cells 301 in the memory chip (e.g., integrated circuit die 105), regardless of how the layer is partitioned to store one or more weight matrices (e.g., 355 and 365), or portions of the weight matrices (e.g., 355 and 365), as if the entire layer (e.g., 305 or 307) were used to store a single weight matrix.

Figure 16:
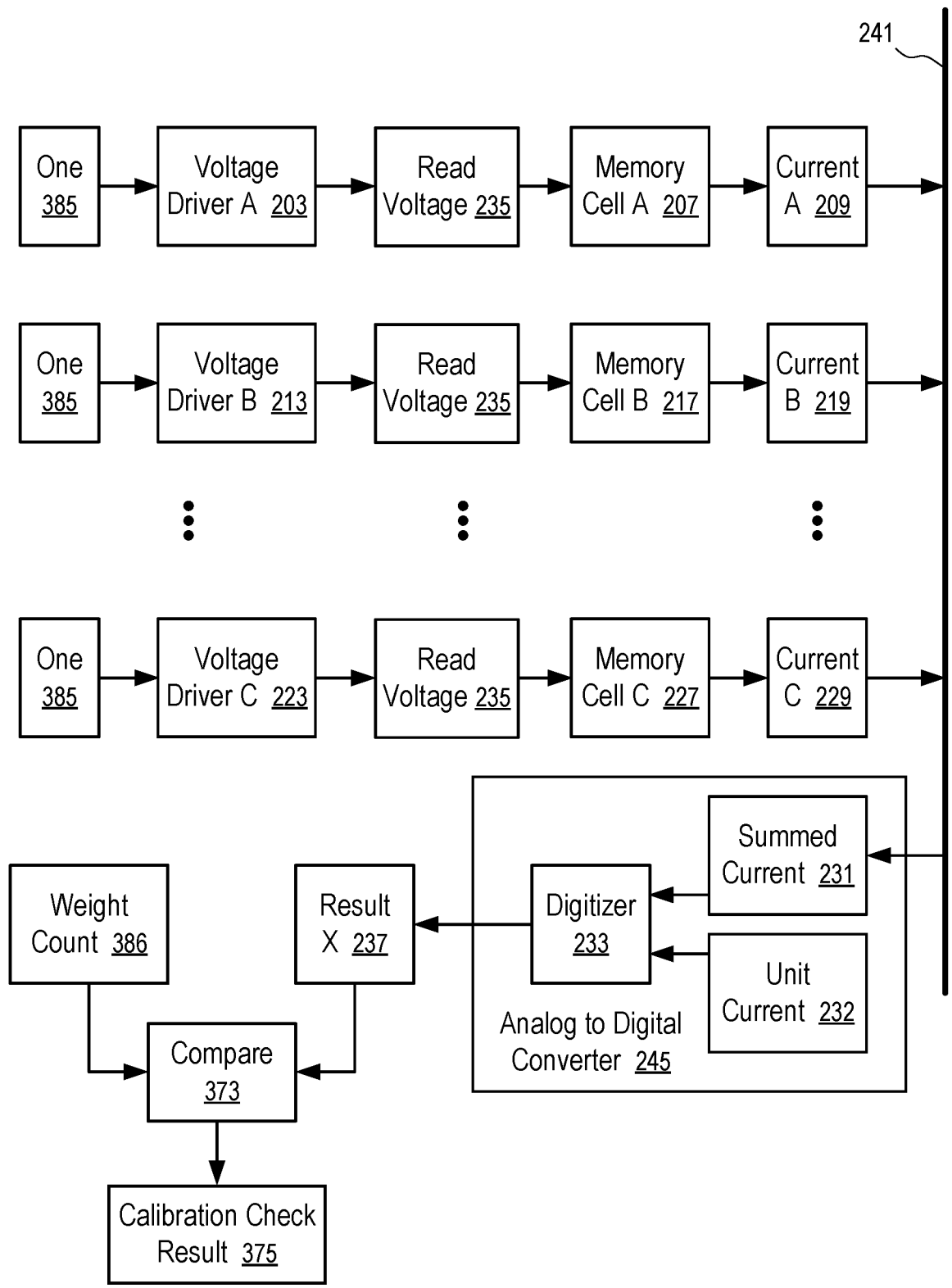
FIG. 16 shows another technique of checking a column of memory cells according to one embodiment.
Figure 17:
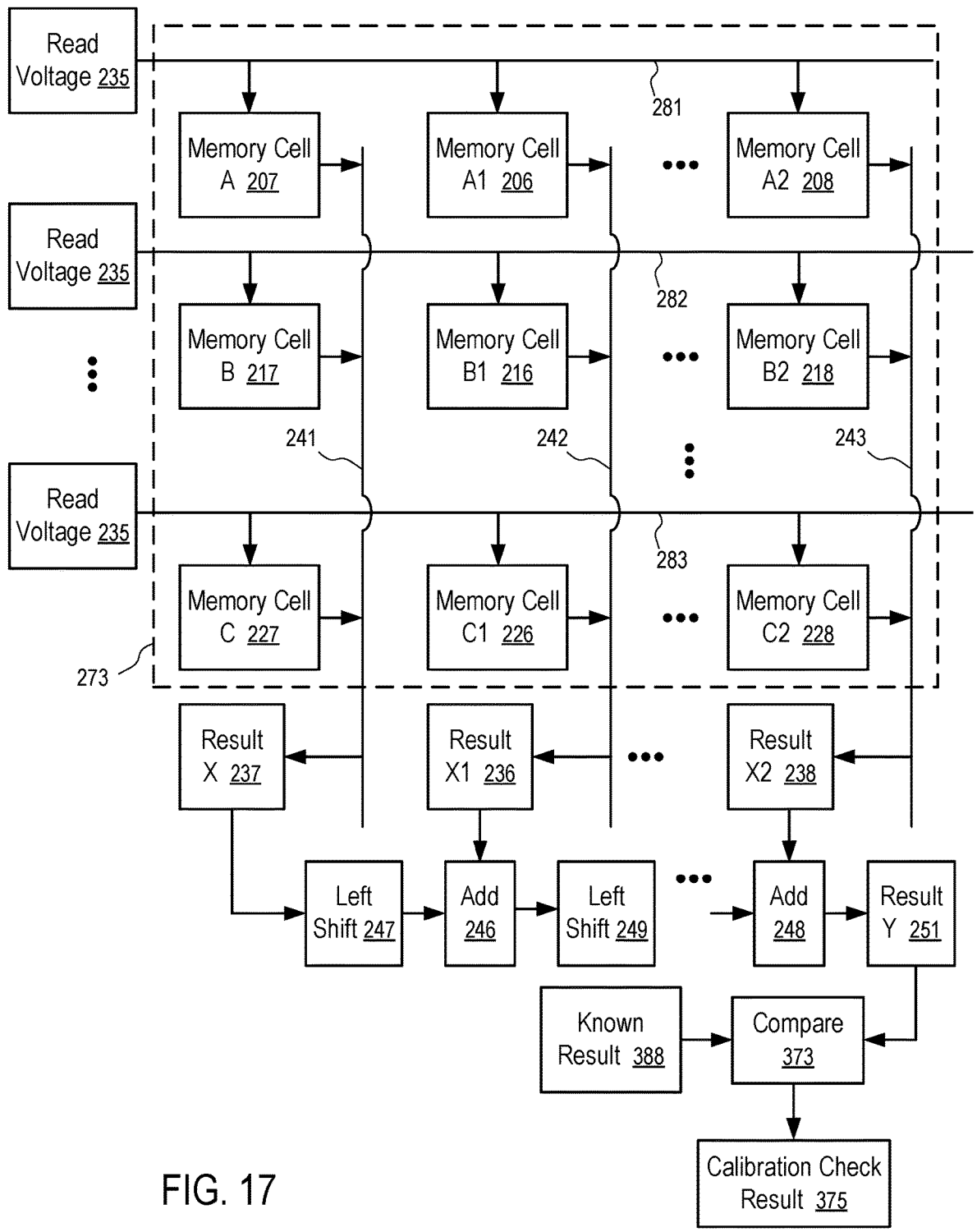
FIG. 17 shows a technique of checking an array of memory cells according to one embodiment.

Optionally, a layer (e.g., 305 or 307) of synapse memory cells 301 in the memory chip (e.g., integrated circuit die 105) can be partitioned into a plurality of predetermined sections, as if each section were used to store a separate weight matrix. The calibration check 378 can be performed for individual sections separately to determine whether the calibration is off in the individual sections. For example, a predetermined section can be a column of memory cells, as illustrated in FIG. 15 and FIG. 16, or an array of memory cells, as illustrated in FIG. 17.

Figure 15:
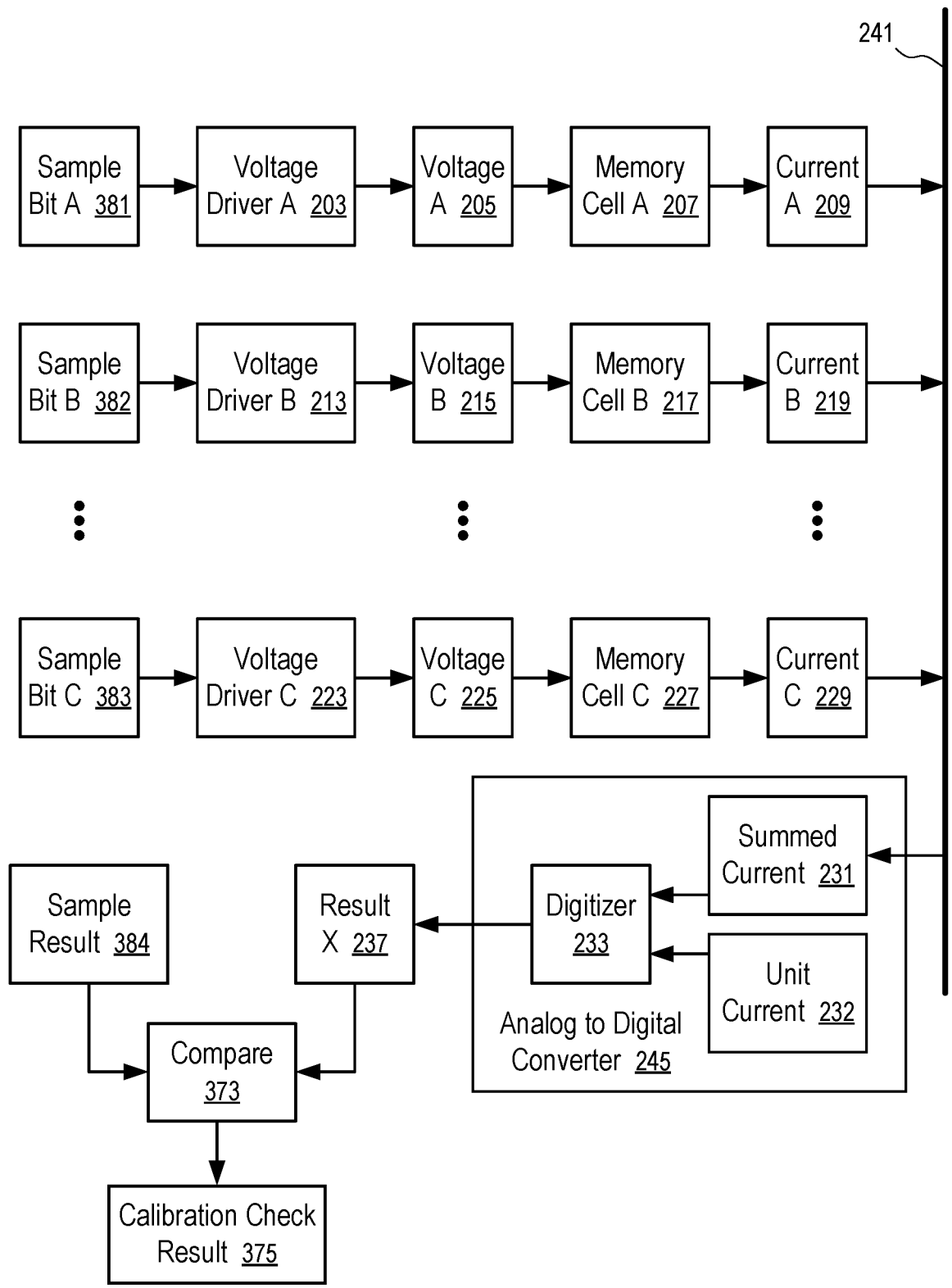
FIG. 15 shows a technique of checking a column of memory cells according to one embodiment.

FIG. 15 shows a technique of checking a column of memory cells according to one embodiment. For example, the technique of FIG. 15 can be implemented in the integrated circuit devices 101 of FIG. 1, FIG. 2, FIG. 3, FIG. 9, and FIG. 10.

In FIG. 15, a column of memory cells 207, 217, . . . , 227 are programmed in the synapse mode to store a column of weight bits. The memory cells 207, 217, . . . , 227 are connected to output their currents 209, 219, . . . , 229 to a bitline (e.g., line 241) for summation. During a calibration check 378, a column of sample bits 381, 382, . . . , 383 are applied to the voltage drivers 203, 213, . . . , 223 to generate voltages 205, 215, . . . , 225 applied to the synapse memory cells 207, 217, . . . , 227 respectively. The digitizer 233 connected to the bitline (e.g., line 241) converts the summed current 231 to generate a result 237 representative of the operation of multiplication and accumulation applied to the column of weight bits stored in the memory cells 207, 217, ..., 227 and the column of sample bits 381, 382, ..., 383. The integrated circuit device 101 stores a known, sample result 384 of the operation of multiplication and accumulation. For example, the known, sample result 384 can be stored in a storage memory cell layer and read in parallel with the operation of multiplication and accumulation applied to the column of weight bits stored in the memory cells 207, 217, ..., 227. The integrated circuit device 101 includes a logic circuit configured to compare 373 the sample result 384 and the computed result 237 to generate a calibration check result 375 for the column of memory cells 207, 217, ..., 227. The logic circuit can be implemented in a layer 309 of the memory chip (e.g., integrated circuit die 105) or in the logic chip (e.g., integrated circuit die 109).

When the calibration check 378 is performed in the way as illustrated in FIG. 15, the location of a corruption in calibration can be narrowed down to a column of memory cells 207, 217, ..., 227; and the calibration check 378 for the column of memory cells 207, 217, ..., 227 can be performed when the cells 207, 217, ..., 227 are not used for a computation task and can be performed in parallel with operations of multiplication and accumulation performed using other columns of memory cells in a same layer, or in a different layer of memory cells. Thus, the impact of the calibration check 378 on the performance of the integrated circuit device 101 can be reduced or minimized.

In some implementations, the sample bits 381, 382, ..., 383 are predetermined and can be generated without reading a set of storage memory cells in the memory chip (e.g., integrated circuit die 105). For example, the sample bits 381, 382, ..., 383 can be a column of ones to count the number of memory cells, within the column of memory cells 207, 217, ..., 227, storing a weight bit of one, as illustrated in FIG. 16.

FIG. 16 shows another technique of checking a column of memory cells according to one embodiment. For example, the technique of FIG. 16 can be implemented in the integrated circuit devices 101 of FIG. 1, FIG. 2, FIG. 3, FIG. 9, and FIG. 10.

In FIG. 16, the integrated circuit device 101 generates a column of ones 385 to cause the voltage drivers 203, 213, ..., 223 to apply the predetermined read voltage 235 to the column of memory cells 207, 217, ..., 227. When the calibration of the memory cells 207, 217, ..., 227 is correct, the portion of the memory cells 207, 217, ..., 227 each storing a weight bit of one can output a current that is substantially the same as the predetermined amount of current 232; and the portion of the memory cells 207, 217, ..., 227 each storing a weight bit of zero can output a current that is substantially negligible when compared to the predetermined amount of current 232. Thus, the result 237 generated by the current digitizer 233 is equal to a weight count 386 of ones stored in the column of memory cells 207, 217, ..., 227. When the output currents (e.g., 209, 219, ..., 229) the memory cells 207, 217, ..., 227 are subjected to similar influences (e.g., increase or decrease in output current due to environmental changes), weight corruption can be detected reliably via comparing 373 the predetermined weight count 386 and the computed result 237.

A column of synapse memory cells 207, 217, ..., 227 used together (e.g., in a weight matrix 355 or 365) can be subjected to similar disturbs (e.g., read disturbs, environmental changes). Thus, it can be advantages to group a column of synapse memory cells 207, 217, ..., 227 according to their use in weight matrices 341 to perform a calibration check 378 using the technique of FIG. 16. When the technique of FIG. 16 is used, the need to store and read a column of sample bits 381, 382, ..., 383 can be eliminated.

In some implementations, the calibration check 378 of multiple columns can be performed via the combination of results 237, 236, ..., 238 of multiplication and accumulation through shifters 277 and adders 279 of multiplier-accumulator units 270 to reduce the operations to compare 373 known results and computed results, as illustrated in FIG. 17.

FIG. 17 shows a technique of checking an array of memory cells according to one embodiment. For example, the technique of FIG. 17 can be implemented in the integrated circuit devices 101 of FIG. 1, FIG. 2, FIG. 3, FIG. 9, and FIG. 10.

In FIG. 17, the predetermined read voltage 235 is applied to the wordlines 281, 282, ..., 283 to exercise the memory cells in the array. In some instances, each of the columns of memory cells (e.g., 207, 217, ..., 237; 206, 216, ..., 226; ...; 208, 218, ..., 228) stores a column of bits corresponding to one significant bit of a column of weights (e.g., 250) in a weight matrix (e.g., 355 or 365). In other instances, columns of memory cells (e.g., 207, 217, ..., 237; 206, 216, ..., 226; ...; 208, 218, ..., 228) are combined for the calibration check, as if each column were corresponding to one significant bit of a column of weights (e.g., 250) in a virtual weight matrix, where the weight bits can actually belong to one or more weight matrix (e.g., 355 and 365).

In FIG. 17, shifters 277 and adders 279 of multiplier-accumulator units 270 are used to combine the column results 237, 236, ..., 238 via operations of left shifting (e.g., 247, 249, ...) and adding (e.g., 246, 248, ...) to generate a computed result 251. The integrated circuit device 101 compares the computed result 251 with a known result 388 to determine the calibration check result 375.

When the shifters 277 and adders 279 are used to combine the results 237, 236, ..., 238 into a combined result 251, the integrated circuit device 101 does not have to perform comparisons for the column results 237, 236, ..., 238 separately.

FIG. 17 illustrates an example of applying the same read voltage 235 to all of the wordlines 281, 282, ..., 283 in a way as in FIG. 16. Alternatively, a set of sample bits 381, 382, ..., 383 can be used to generate the voltages 205, 215, ..., 225 for the wordlines 281, 282, ..., 283 as in FIG. 15.

In general, the techniques of FIG. 15, FIG. 16, and FIG. 17 can be used separately or in combination.

In some instances, when the calibration of a column of synapse memory cells (e.g., 207, 217, ..., 227), or an array 273 of synapse memory cells, is found to be incorrect or off (e.g., due to being operated at an extreme temperature), it can be assumed that the entire set of synapse memory cells 301 in the integrated circuit device 101 needs to be refreshed or reprogrammed (e.g., to operation at the extreme temperature).

In other instances, when the calibration of a column of synapse memory cells (e.g., 207, 217, ..., 227), or an array 273 of synapse memory cells, is found to be incorrect or off (e.g., due to read disturb), a portion of synapse memory cells 301 in the integrated circuit device 101 that are used together (e.g., as a portion of a weight matrix 355 or 365) can be refreshed or reprogrammed, while other synapse memory cells may not need refreshing or reprogramming.

Figure 18:
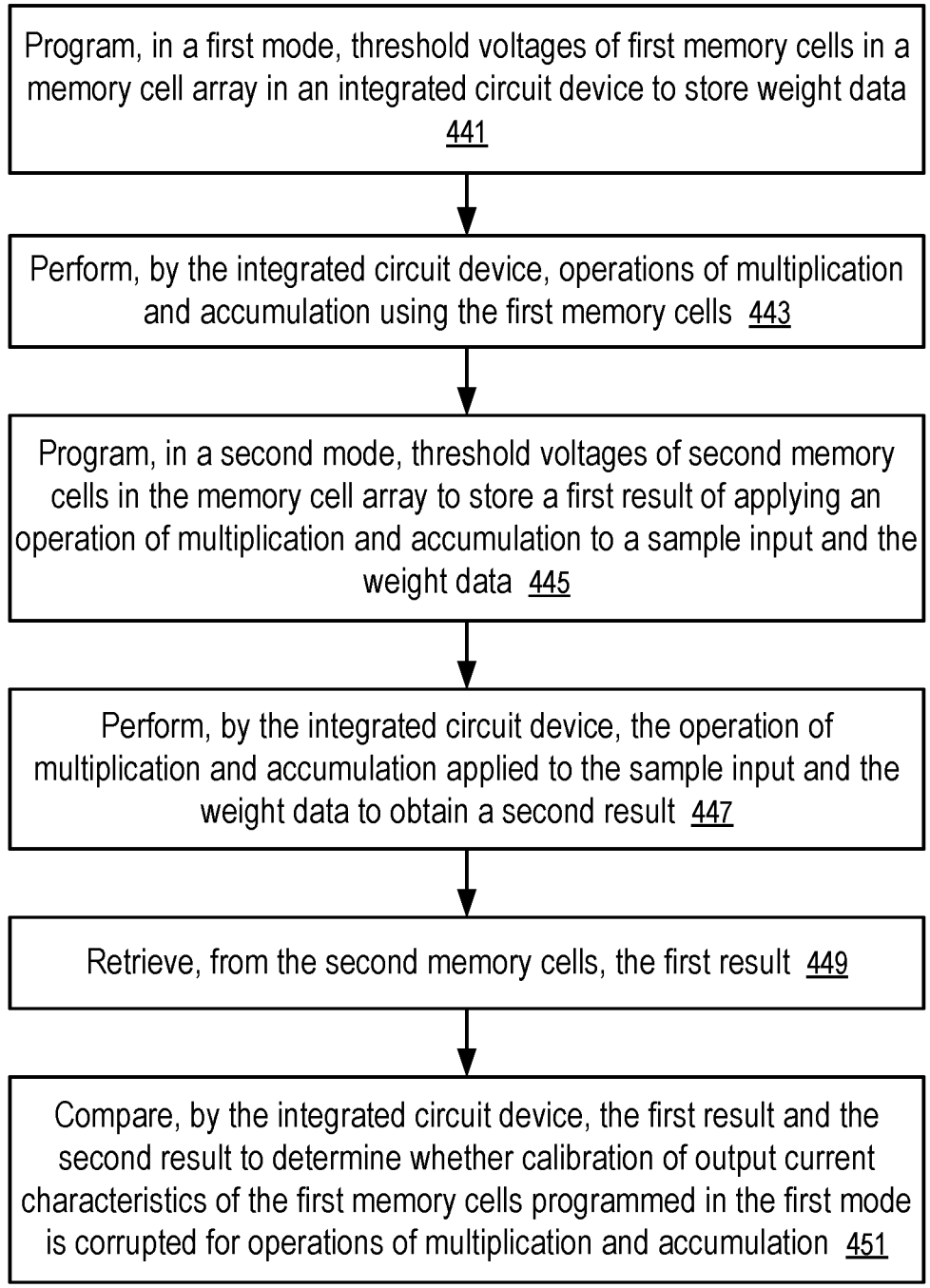
FIG. 18 shows a method of calibration check for memory cells programmed to perform operations of multiplication and accumulation according to one embodiment.

FIG. 18 shows a method of calibration check for memory cells programmed to perform operations of multiplication and accumulation according to one embodiment. For example, the method of FIG. 18 can be implemented to perform calibration checks using the techniques of FIG. 14, FIG. 15, and FIG. 16 in integrated circuit devices 101 and computing systems of FIG. 1, FIG. 2, FIG. 3, FIG. 9, and FIG. 10 with layer configurations of FIG. 7 and FIG. 12, where operations of multiplication and accumulation can be performed according to FIG. 4, FIG. 5, and FIG. 6. For example, the method can be used to implement the computations of an artificial neural network as in FIG. 11.

At block 441, an integrated circuit device 101 programs, in a first mode (e.g., synapse mode) threshold voltages of first memory cells (e.g., 207, 217, . . . , 227) in a memory cell array 113 in the integrated circuit device 101 to store weight data (e.g., weight matrices 341).

For example, the memory cell array 113 can be configured as a plurality of layers (e.g., 305, 307) on a memory chip (e.g., integrated circuit die 105) of the integrated circuit device 101. Each of the layers (e.g., 303, 305, . . . , 307) can have a plurality of columns of memory cells (e.g., 207, 217, . . . , 227) having output currents (e.g., 209, 219, . . . , 229) connected to a plurality of bitlines (e.g., line 241) respectively. Each of the layers (e.g., 303, 305, . . . , 307) can have rows of memory cells connected to wordlines (e.g., lines 281, 282, . . . , 283) respectively to receive applied voltages (e.g., 205, 215, . . . , 225) generated by voltage drivers (e.g., 203, 213, . . . , 223) according to input bits (e.g., 201, 211, . . . , 221).

Memory cells 301 programmed in the synapse mode can be used as part of multiplier-accumulator units 270 as illustrated in FIG. 4, FIG. 5, and FIG. 6. To perform an operation of multiplication and accumulation, Wordlines (e.g., lines 281, 282, . . . , 283) in an array 273 of synapse memory cells 301 can be selected according to a column of input bits (e.g., 201, 211, . . . , 221) to have a predetermined read voltage applied concurrently for bitwise multiplication to output currents (e.g., 209, 219, . . . , 229) into the bitlines (e.g., lines 241); and the integrated circuit device 101 can have analog to digital converters (e.g., 245) configured to digitize summed currents (e.g., 231) in the bitlines (e.g., line 241) as multiple of a predetermined amount of current (e.g., 232).

Each respective memory cell 301 in the memory cell array 113 can have a threshold voltage programmable in the first mode (e.g., synapse mode) to be used as part of multiplier-accumulator units 270, or in a second mode (e.g., storage mode) not usable as part of a multiplier-accumulator units 270. For example, when a memory cell 301 programmed in the synapse mode is found to have incorrect weight programming and thus have produced an erroneous result in an operation of multiplication and accumulation, the correct weight of the memory cell 301 can be looked up from the backup data stored in a storage memory cell and used to reprogram or refresh the weight programming of the synapse memory cell.

For example, when programmed in the first mode (e.g., synapse mode) and applied a predetermined read voltage 235, each respective memory cell 301 in the memory cell array 113 can output either a predetermined amount of current 232 to represent a bit of weight of one stored in the respective memory cell 301, or a negligible amount of current to represent a bit of weight of zero stored in the respective memory cell 301. Thus, the synapse memory cell 301 is programmed to store one bit per cell. The drift of the threshold voltage of a synapse memory cell 301 storing a bit of weight of one can produce an incorrect amount of current when read using the predetermined read voltage. The incorrect amount of current can cause an error in the computation results generated using the synapse memory cell 301 having the drifted threshold voltage and thus corrupted weight programming. The output current of the synapse memory cell 301 can also change when the current operating temperature of the synapse memory cell 301 is different from the temperature of programming the threshold voltage of the synapse memory cell 301.

In contrast, when programmed in the second mode (e.g., storage mode), a threshold voltage of the respective memory cell is positioned within a voltage region among a plurality of voltage regions pre-associated with a plurality of values respectively. Drifting of the threshold voltage within the voltage region has no impact on the retrieving of the value stored in the storage memory cell. To determine whether the threshold voltage is within the voltage region, the storage memory cell can be applied a lower voltage of the voltage region and then applied a higher voltage of the voltage region. If the storage memory cell outputs a negligible amount of current at the lower voltage but more than a threshold amount of current at the higher voltage, it can be concluded that the threshold voltage is in the voltage region. Further, data stored in storage memory cells can be protected using an error correct code technique. Thus, a small amount of random errors in reading storage memory cells can be detected and corrected without data loss. When the threshold voltage of a storage memory cell is programmed to one of more than two voltage regions, the storage memory cell can store more than one bit of data per cell.

At block 443, the integrated circuit device 101 performs operations of multiplication and accumulation using the first memory cells (e.g., 207, 217, . . . , 227).

For example, within a predetermined time period following the programming of the first memory cells (e.g., 207, 217, . . . , 227) in the synapse mode, the calibration of the output current characteristics of the first memory cells (e.g., 207, 217, . . . , 227) can be considered intact and correct, when the integrated circuit device 101 is operated at a condition similar to the condition of programming the first memory cells (e.g., 207, 217, . . . , 227). For example, when the operating temperature of the integrated circuit device 101 has an offset or a difference, from a predetermined temperature, that is no more than a temperature variation threshold or limit, the integrated circuit device 101 can be considered operating operated at a condition similar to the condition of programming the first memory cells (e.g., 207, 217, . . . , 227). For example, the predetermined temperature can be the temperature of the last programming or refreshing of the threshold voltages of the first memory cells (e.g., 207, 217, . . . , 227).

However, after the current operating temperature of the integrated circuit device 101 has an offset, from the predetermined temperature, that is more than the temperature variation threshold or limit, the integrated circuit device 101 can perform a calibration check 378.

Alternatively, or in combination, the calibration check 378 can be triggered based on a time interval. For example, a calibration check 378 can be triggered in response to a determination that a lapsed time, from the threshold voltages of the first memory cells (e.g., 207, 217, . . . , 227) being programmed to store the weight data (e.g., a portion of the weight matrices 341), is longer than a predetermined time interval.

In some implementations, the integrated circuit device 101 is configured to perform a calibration check 378, when the lapsed time is longer than a first predetermined time interval and when the integrated circuit device 101 has no pending computing tasks that use the first memory cells (e.g., 207, 217, . . . , 227) to avoid or reduce impacts on computing tasks. The integrated circuit device 101 is configured to suspend pending computing tasks, if any, and start a calibration check 378, when the lapsed time is longer than a second predetermined time interval that is longer than the first predetermined time interval, to reduce the likelihood of generating incorrect results using the incorrectly calibrated first memory cells (e.g., 207, 217, . . . , 227).

At block 445, the integrated circuit device 101 programs, in a second mode (e.g., storage mode), threshold voltages of second memory cells (e.g., 301 in layer 308 or 303 in FIG. 12, or another layer in FIG. 7) in the memory cell array 113 to store a first result (e.g., result 384 or 388, or weight count 386) of applying an operation of multiplication and accumulation to a sample input and the weight data.

At block 447, the integrated circuit device 101 performs the operation of multiplication and accumulation applied to the sample input and the weight data to obtain a second result.

For example, the first memory cells can be configured in the memory cell array 113 as a column of memory cells (e.g., 207, 217, . . . , 227) connected to a common bitline (e.g., line 241); and the second result (e.g., 237) can be generated by a current digitizer 233 connected to the bitline (e.g., line 241) by digitizing the current 231 summed in the bitline (e.g., line 241) as a multiple of a predetermined amount of current 232.

For example, the sample input can be a column of ones 385 applied to control a column of voltage drivers 203, 213, . . . , 223 configured on wordlines (e.g., lines 281, 282, . . . , 283) connected to the first memory cells 207, 217, . . . , 227 respectively. The column of voltage drivers 203, 213, . . . , 223 can be generated by the integrated circuit device 101 without reading a set of memory cells to retrieve the column of ones 385.

In some implementations, the sample input has a column of sample bits 381, 382, . . . , 383. The integrated circuit device 101 can program, in the second mode (e.g., storage mode), third memory cells (e.g., 301 in layer 308 or 303 in FIG. 12, or another layer in FIG. 7) in the memory cell array to store the sample input and retrieve, from the third memory cells, the sample input to perform the operation of multiplication and accumulation applied to the sample input and the weight data.

In some implementations, the sample input and the first result are derived from the computing tasks performed by the integrated circuit device 101 when the calibration of the first memory cells (e.g., 207, 217, . . . , 227) is considered intact and correct. The input data and the corresponding result can be tagged and/or stored as samples for use in a calibration check 378.

For example, the integrated circuit device 101 can have a first integrated circuit die 103 having an image sensing pixel array 111. After the image sensing pixel array 111 captures an image to generate image data 351, an inference logic circuit 123 configured in a second integrated circuit die 109 can execute computation instructions 345 of an artificial neural network to process the image data 351. Alternatively, the image data 351 can be received via an interface 125 of the integrated circuit device 101 (e.g., from an external image sensor 333 or a microprocessor 337). For example, the computations of the artificial neural network can be performed in a way as illustrated in FIG. 11, in which the inference logic circuit 123 uses synapse memory cells 301, configured in a third integrated circuit die 105 and storing the weight matrices (e.g., 355, 365), to perform the operations of multiplication and accumulation (e.g., 357, 367).

Some of the inputs (e.g., input column 353, data column 363) can be stored as the sample input with their corresponding results (e.g., data column 359).

In another example, the first memory cells are configured in the memory cell array 113 as a plurality of columns of memory cells (e.g., 207, 217, . . . , 227; 206, 216, . . . , 226; . . . , 208, 218, . . . , 228) that are connected to a plurality of bitlines (e.g., lines 241, 242, . . . , 243) respectively. The second result can be generated from digitizing currents (e.g., 231) in the bitlines (e.g., line 241) as multiples of a predetermined amount of current 232 to generate column outputs (e.g., results 237, 236, . . . , 238). Each of the column outputs (e.g., results 237, 236, . . . , 238) can be associated with the weight of a different significant bit (e.g., 257, 258, . . . , or 259) in a number (e.g., weight 250). The integrated circuit device 101 can combine the column outputs (e.g., results 237, 236, . . . , 238) via shifting (e.g., 247, 249) and adding (246, 248) to generate the second result.

In a further example, the calibration check 378 can be configured to include the computations of activation functions 361 of artificial neurons; and the known result of an artificial neural network responding to a sample input data (e.g., image data 372) and the result or output of the artificial neural network responding to the sample input data (e.g., image data 372) and computed using the synapse memory cells 301 storing the weight matrices (e.g., 355, 365) can be compared to determine if the calibration of the synapse memory cells 301 are intact and correct.

At block 449, the integrated circuit device 101 retrieves, from the second memory cells, the first result.

For example, the retrieving of the first result from the second memory cells can be performed in parallel with the performing of the operation of multiplication and accumulation applied to the sample input and the weight data to obtain the second result.

In some instances, the calibration check 378 for the first memory cells (e.g., storing the weight matrix 355) is performed in parallel with the integrated circuit device 101 using other synapse memory cells (e.g., storing the weight matrix 365) to perform a computing task (e.g., processing a new image from the image sensing pixel array 111 or an external image sensor 333).

For example, the weight matrix 355 can be programmed into the first memory cells 301 configured on a first subset of the layers (e.g., 305, . . . , 307) (or first columns of memory cells); and the weight matrix 365 can be programmed into the other synapse memory cells 301 configured on a second subset of the layers (or second columns of memory cells). The first subset and the second subset can operate in parallel. Thus, when the integrated circuit device 101 is using the weight matrix 365 to perform the operation of multiplication and accumulation 367, the first memory cells 301 are not used. Performing the calibration check 378 on the first memory cells 301 while the integrated circuit device 101 is performing the normal computation task using the weight matrix 365 can reduce or eliminate the impact of the calibration check 378 on the performance of the integrated circuit device 101.

At block 451, the integrated circuit device 101 compares the first result and the second result to determine whether calibration of output current characteristics of the first memory cells programmed in the first mode is corrupted for operations of multiplication and accumulation.

For example, when the integrated circuit device 101 is performing the computations of the artificial neural network using a first portion of the weight matrices 341 of the artificial neural network (e.g., weight matrix 355) to process new image data 351, the integrated circuit device 101 can simultaneously perform a calibration check on a second portion of the weight matrices 341 of the artificial neural network (e.g., weight matrix 365). The calibration check can be triggered based on a current temperature of the integrated circuit device 101. For example, the calibration check can be performed using the techniques of FIG. 15, FIG. 16, or FIG. 17, or any combination thereof. If the calibration check result 375 is positive, the result of the computations of the artificial neural network performed using a first portion of the weight matrices 341 of the artificial neural network (e.g., weight matrix 355) to process the new image data 351 can be accepted. Otherwise, the integrated circuit device 101 can suspend the processing of the new image data 351. The integrated circuit device 101 can resume the processing of the new image data after the current temperature of the integrated circuit device 101 returns to a predetermined range, or after synapse memory cells storing the weight matrices 341 are re-calibrated at the current temperature.

Integrated circuit devices 101 (e.g., as in FIG. 1, FIG. 2, FIG. 3, FIG. 9, and FIG. 10) can be configured as a storage device, a memory module, or a hybrid of a storage device and memory module. Examples of a storage device include a solid-state drive (SSD), a flash drive, a universal serial bus (USB) flash drive, an embedded multi-media controller (eMMC) drive, a universal flash storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The integrated circuit devices 101 (e.g., as in FIG. 1, FIG. 2, FIG. 3, FIG. 9, and FIG. 10) can be installed in a computing system as a memory sub-system having an embedded image sensor and an inference computation capability. Such a computing system can be a computing device such as a desktop computer, a laptop computer, a network server, a mobile device, a portion of a vehicle (e.g., airplane, drone, train, automobile, or other conveyance), an internet of things (IoT) enabled device, an embedded computer (e.g., one included in a vehicle, industrial equipment, or a networked commercial device), or such a computing device that includes memory and a processing device.

In general, a computing system can include a host system that is coupled to one or more memory sub-systems (e.g., integrated circuit device 101 of FIG. 1, FIG. 2, FIG. 3, FIG. 9, and FIG. 10). In one example, a host system is coupled to one memory sub-system. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

For example, the host system can include a processor chipset (e.g., processing device) and a software stack executed by the processor chipset. The processor chipset can include one or more cores, one or more caches, a memory controller (e.g., NVDIMM controller), and a storage protocol controller (e.g., PCIe controller, SATA controller). The host system uses the memory sub-system, for example, to write data to the memory sub-system and read data from the memory sub-system.

The host system can be coupled to the memory sub-system via a physical host interface. Examples of a physical host interface include, but are not limited to, a serial advanced technology attachment (SATA) interface, a peripheral component interconnect express (PCIe) interface, a universal serial bus (USB) interface, a fibre channel, a serial attached SCSI (SAS) interface, a double data rate (DDR) memory bus interface, a small computer system interface (SCSI), a dual in-line memory module (DIMM) interface (e.g., DIMM socket interface that supports double data rate (DDR)), an open NAND flash interface (ONFI), a double data rate (DDR) interface, a low power double data rate (LPDDR) interface, a compute express link (CXL) interface, or any other interface. The physical host interface can be used to transmit data between the host system and the memory sub-system. The host system can further utilize an NVM express (NVMe) interface to access components (e.g., memory devices) when the memory sub-system is coupled with the host system by the PCIe interface. The physical host interface can provide an interface for passing control, address, data, and other signals between the memory sub-system and the host system. In general, the host system can access multiple memory sub-systems via a same communication connection, multiple separate communication connections, or a combination of communication connections.

The processing device of the host system can be, for example, a microprocessor, a central processing unit (CPU), a processing core of a processor, an execution unit, etc. In some instances, the controller can be referred to as a memory controller, a memory management unit, or an initiator. In one example, the controller controls the communications over a bus coupled between the host system and the memory sub-system. In general, the controller can send commands or requests to the memory sub-system for desired access to memory devices. The controller can further include interface circuitry to communicate with the memory sub-system. The interface circuitry can convert responses received from memory sub-system into information for the host system.

The controller of the host system can communicate with controller of the memory sub-system to perform operations such as reading data, writing data, or erasing data at the memory devices, and other such operations. In some instances, the controller is integrated within the same package of the processing device. In other instances, the controller is separate from the package of the processing device. The controller or the processing device can include hardware such as one or more integrated circuits (ICs), discrete components, a buffer memory, or a cache memory, or a combination thereof. The controller or the processing device can be a microcontroller, special-purpose logic circuitry (e.g., a field programmable gate array (FPGA), an application specific integrated circuit (ASIC), etc.), or another suitable processor.

The memory devices can include any combination of the different types of non-volatile memory components and volatile memory components. The volatile memory devices can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, or a PLC portion of memory cells, or any combination thereof. The memory cells of the memory devices can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), spin transfer torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller (or controller for simplicity) can communicate with the memory devices to perform operations such as reading data, writing data, or erasing data at the memory devices and other such operations (e.g., in response to commands scheduled on a command bus by controller). The controller can include hardware such as one or more integrated circuits (ICs), discrete components, or a buffer memory, or a combination thereof. The hardware can include digital circuitry with dedicated (i.e., hard-coded) logic to perform the operations described herein. The controller can be a microcontroller, special-purpose logic circuitry (e.g., a field programmable gate array (FPGA), an application specific integrated circuit (ASIC), etc.), or another suitable processor.

The controller can include a processing device (processor) configured to execute instructions stored in a local memory. In the illustrated example, the local memory of the controller includes an embedded memory configured to store instructions for performing various processes, operations, logic flows, and routines that control operation of the memory sub-system, including handling communications between the memory sub-system and the host system.

In some embodiments, the local memory can include memory registers storing memory pointers, fetched data, etc. The local memory can also include read-only memory (ROM) for storing micro-code. While the example memory sub-system includes a controller, in another embodiment of the present disclosure, a memory sub-system does not include a controller, and can instead rely upon external control (e.g., provided by an external host, or by a processor or controller separate from the memory sub-system).

In general, the controller can receive commands or operations from the host system and can convert the commands or operations into instructions or appropriate commands to achieve the desired access to the memory devices. The controller can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices. The controller can further include host interface circuitry to communicate with the host system via the physical host interface. The host interface circuitry can convert the commands received from the host system into command instructions to access the memory devices as well as convert responses associated with the memory devices into information for the host system.

The memory sub-system can also include additional circuitry or components that are not illustrated. In some embodiments, the memory sub-system can include a cache or buffer (e.g., DRAM) and address circuitry (e.g., a row decoder and a column decoder) that can receive an address from the controller and decode the address to access the memory devices.

In some embodiments, the memory devices include local media controllers that operate in conjunction with memory sub-system controller to execute operations on one or more memory cells of the memory devices. An external controller (e.g., memory sub-system controller) can externally manage the memory device (e.g., perform media management operations on the memory device). In some embodiments, a memory device is a managed memory device, which is a raw memory device combined with a local media controller for media management within the same memory device package. An example of a managed memory device is a managed NAND (MNAND) device.

The controller or a memory device can include a storage manager configured to implement storage functions discussed above. In some embodiments, the controller in the memory sub-system includes at least a portion of the storage manager. In other embodiments, or in combination, the controller or the processing device in the host system includes at least a portion of the storage manager. For example, the controller, the controller, or the processing device can include logic circuitry implementing the storage manager. For example, the controller, or the processing device (processor) of the host system, can be configured to execute instructions stored in memory for performing the operations of the storage manager described herein. In some embodiments, the storage manager is implemented in an integrated circuit chip disposed in the memory sub-system. In other embodiments, the storage manager can be part of firmware of the memory sub-system, an operating system of the host system, a device driver, or an application, or any combination therein.

In one embodiment, an example machine of a computer system within which a set of instructions, for causing the machine to perform any one or more of the methods discussed herein, can be executed. In some embodiments, the computer system can correspond to a host system that includes, is coupled to, or utilizes a memory sub-system or can be used to perform the operations described above. In alternative embodiments, the machine can be connected (e.g., networked) to other machines in a LAN, an intranet, an extranet, or the internet, or any combination thereof. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a personal digital assistant (PDA), a cellular telephone, a web appliance, a server, a network router, a switch or bridge, a network-attached storage facility, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system includes a processing device, a main memory (e.g., read-only memory (ROM), flash memory, dynamic random access memory (DRAM) such as synchronous DRAM (SDRAM) or Rambus DRAM (RDRAM), static random access memory (SRAM), etc.), and a data storage system, which communicate with each other via a bus (which can include multiple buses).

Processing device represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device can also be one or more special-purpose processing devices such as an application specific integrated circuit (ASIC), a field programmable gate array (FPGA), a digital signal processor (DSP), network processor, or the like. The processing device is configured to execute instructions for performing the operations and steps discussed herein. The computer system can further include a network interface device to communicate over the network.

The data storage system can include a machine-readable medium (also known as a computer-readable medium) on which is stored one or more sets of instructions or software embodying any one or more of the methodologies or functions described herein. The instructions can also reside, completely or at least partially, within the main memory and within the processing device during execution thereof by the computer system, the main memory and the processing device also constituting machine-readable storage media. The machine-readable medium, data storage system, or main memory can correspond to the memory sub-system.

In one embodiment, the instructions include instructions to implement functionality corresponding to the operations described above. While the machine-readable medium is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work most effectively to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special-purpose circuitry, with or without software instructions, such as using application-specific integrated circuit (ASIC) or field-programmable gate array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   programming, in a first mode, threshold voltages of first memory cells in a memory cell array in an integrated circuit device to store weight data;
   performing, by the integrated circuit device, operations of multiplication and accumulation using the first memory cells;
   programming, in a second mode, threshold voltages of second memory cells in the memory cell array to store a first result of applying an operation of multiplication and accumulation to a sample input and the weight data;
   performing, by the integrated circuit device, the operation of multiplication and accumulation applied to the sample input and the weight data to obtain a second result;
   retrieving, from the second memory cells, the first result; and
   comparing, by the integrated circuit device, the first result and the second result to determine whether calibration of output current characteristics of the first memory cells programmed in the first mode is corrupted for operations of multiplication and accumulation.

2. The method of claim 1, wherein each respective memory cell in the memory cell array is configured to output, when a threshold voltage of the respective memory cell is programmed in the first mode and the respective memory cell is applied a predetermined read voltage:
   a predetermined amount of current to represent a weight of one stored in the respective memory cell; or
   a negligible amount of current to represent a weight of zero stored in the respective memory cell;
   wherein the threshold voltage of the respective memory cell is positioned within a voltage region among a plurality of voltage regions pre-associated with a plurality of values respectively when programmed in the second mode.

3. The method of claim 2, wherein the respective memory cell in the memory cell array is configured to store one bit per cell when programmed in the first mode; and the respective memory cell in the memory cell array is configured to store more than one bit per cell when programmed in the second mode.

4. The method of claim 3, wherein the performing of the operation of multiplication and accumulation applied to the sample input and the weight data to obtain the second result is in response to a determination that a current operating temperature of the integrated circuit device has an offset, from a predetermined temperature, that is more than a threshold.

5. The method of claim 4, wherein the predetermined temperature is an operating temperature at a time of the threshold voltages of the first memory cells being programmed to store the weight data.

6. The method of claim 3, wherein the performing of the operation of multiplication and accumulation applied to the sample input and the weight data to obtain the second result is in response to a determination that a lapsed time, from the threshold voltages of the first memory cells being programmed to store the weight data, is longer than a predetermined time interval; and
   wherein the performing of the operation of multiplication and accumulation applied to the sample input and the weight data to obtain the second result is further in response to a determination that there is no pending request to use the first memory cells to perform operations of multiplication and accumulation.

7. The method of claim 3, wherein the first memory cells are configured in the memory cell array as a column connected to a common bitline; and the second result is generated from digitizing a current in the bitline as a multiple of a predetermined amount of current.

8. The method of claim 7, wherein the sample input includes a column of ones applied to control a column of voltage drivers configured on wordlines connected to the first memory cells respectively.

9. The method of claim 7, further comprising:
   programming, in the second mode, third memory cells to store the sample input; and
   retrieving, from the third memory cells, the sample input to perform the operation of multiplication and accumulation applied to the sample input and the weight data;
   wherein the retrieving of the first result from the second memory cells is in parallel with:
      the performing of the operation of multiplication and accumulation applied to the sample input and the weight data to obtain the second result; and
      performing a further operation of multiplication and accumulation applied to a separate input and separate weight data stored, via programming in the first mode, in further memory cells in the memory cell array.

10. The method of claim 3, wherein the first memory cells are configured in the memory cell array as a plurality of columns connected to a plurality of bitlines respectively; and the second result is generated from digitizing currents in the bitlines as multiples of a predetermined amount of current to generate column outputs and combining the column outputs via shifting and adding.

11. A device, comprising:
   a memory cell array, each respective memory cell in the memory cell array having a threshold voltage programmable in a first mode to perform operations of multiplication and accumulation and programmable in a second mode to store data;
   a register configured to store data indicative of whether the device is in a mode of calibration check; and
   a logic circuit;
   wherein the device is configured to:
      program, in the first mode, threshold voltages of first memory cells in the memory cell array to store weight data;

perform operations of multiplication and accumulation using the first memory cells;

program, in the second mode, threshold voltages of second memory cells in the memory cell array to store a first result of applying an operation of multiplication and accumulation to a sample input and the weight data;

perform, in response to the register being indicative of the mode of calibration check, the operation of multiplication and accumulation applied to the sample input and the weight data to obtain a second result; and comparing, by the integrated circuit device, the first result retrieved from the second memory cells and the second result to determine whether calibration of output current characteristics of the first memory cells programmed in the first mode is corrupted for operations of multiplication and accumulation.

12. The device of claim 11, wherein the respective memory cell in the memory cell array is configured to output, when the threshold voltage of the respective memory cell is programmed in the first mode and the respective memory cell is applied a predetermined read voltage:

a predetermined amount of current to represent a weight of one stored in the respective memory cell; or a negligible amount of current to represent a weight of zero stored in the respective memory cell;

wherein the threshold voltage of the respective memory cell is positioned within a voltage region among a plurality of voltage regions pre-associated with a plurality of values respectively when programmed in the second mode; and wherein the respective memory cell in the memory cell array is configured to store one bit per cell when programmed in the first mode; and the respective memory cell in the memory cell array is configured to store more than one bit per cell when programmed in the second mode.

13. The device of claim 12, wherein the device is configured to perform the operation of multiplication and accumulation applied to the sample input and the weight data to obtain the second result in response to a determination that a current operating temperature of the integrated circuit device has an offset, from a predetermined temperature, that is more than a threshold.

14. The device of claim 13, wherein the predetermined temperature is an operating temperature at a time of the threshold voltages of the first memory cells being programmed to store the weight data.

15. The device of claim 12, wherein the device is configured to perform the operation of multiplication and accumulation applied to the sample input and the weight data to obtain the second result is in response to:

a determination that a lapsed time, from the threshold voltages of the first memory cells being programmed to store the weight data, is longer than a predetermined time interval; and a determination that there is no pending request to use the first memory cells to perform operations of multiplication and accumulation.

16. The device of claim 12, wherein the first memory cells are configured in the memory cell array as a column connected to a common bitline; and the second result is generated from digitizing a current in the bitline as a multiple of a predetermined amount of current; and the device is configured to generate a column of ones applied to control a column of voltage drivers configured on wordlines connected to the first memory cells respectively.

17. The device of claim 12, wherein the first memory cells are configured in the memory cell array as a plurality of columns connected to a plurality of bitlines respectively; and the device further comprises:

current digitizers configured to generate column outputs from currents in the bitlines as multiples of a predetermined amount of current; and logic circuits to shift and add the column outputs to generate the second result.

18. An apparatus, comprising:

an integrated circuit die having a memory cell array configured in a plurality of layers; and an integrated circuit die having a logic circuit;

a register configured to store data indicative of whether the apparatus is in a mode of calibration check;

wherein the logic circuit is configured to:

program, in the first mode, threshold voltages of first memory cells in a first subset of the layers to store data representative of weight matrices of an artificial neural network;

program, in the second mode, threshold voltages of second memory cells in a second subset of the layers to store a first result of applying a sample input to the artificial neural network;

perform, in response to the register being indicative of the mode of calibration check, computations of the artificial neural network using the first memory cells in the first subset to obtain a second result; and compare the first result, retrieved from the second memory cells, and the second result to determine whether calibration of output current characteristics of the first memory cells programmed in the first mode is corrupted for operations of multiplication and accumulation.

19. The apparatus of claim 18, further comprising:

an integrated circuit die having an image sensing pixel array configured to generate image data as an input to the artificial neural network; and an integrated circuit package configured to enclose at least the memory cell array and the logic circuit.

20. The apparatus of claim 19, wherein each respective layer in the first subset has a plurality of columns of memory cells having output currents connected to a plurality of bitlines respectively, the respective layer having rows of memory cells connected to wordlines respectively to receive applied voltages;

wherein the respective layer has wordlines selected according to a column of input bits to have a predetermined read voltage applied concurrently for bitwise multiplication to output currents into the bitlines; and wherein the apparatus further comprises analog to digital converters configured to digitize summed currents in the bitlines as multiple of the predetermined amount of current.

* * * * *